(12) United States Patent
Ishibashi

(10) Patent No.: US 8,154,085 B2
(45) Date of Patent: Apr. 10, 2012

(54) NONVOLATILE SEMICONDUCTOR MEMORY HAS RESISTORS INCLUDING ELECTRODE LAYER FORMED ON LOW RESISTANCE LAYER ADJACENT TO MASK FILM

(75) Inventor: Shigeru Ishibashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 108 days.

(21) Appl. No.: 11/749,956

(22) Filed: May 17, 2007

(65) Prior Publication Data

US 2007/0267685 A1 Nov. 22, 2007

(30) Foreign Application Priority Data

May 18, 2006 (JP) ................................ 2006-139353

(51) Int. Cl.
*H01L 29/788* (2006.01)
*H01L 27/06* (2006.01)

(52) U.S. Cl. ..... 257/380; 257/316; 257/379; 257/E29.3; 257/E27.016; 257/E27.035

(58) Field of Classification Search .............. 257/904, 257/314–316, 350, 358, 359, 379, 380, 516, 257/E29.3, E27.016, E27.024, E27.035
See application file for complete search history.

(56) References Cited

U.S. PATENT DOCUMENTS

| | | | |
|---|---|---|---|
| 6,146,945 A | 11/2000 | Osanai | |
| 6,265,739 B1 * | 7/2001 | Yaegashi et al. | 257/296 |
| 6,667,507 B2 | 12/2003 | Shirota et al. | |
| 7,442,985 B2 * | 10/2008 | Ichige et al. | 257/315 |
| 2002/0070402 A1 * | 6/2002 | Ichige et al. | 257/296 |
| 2002/0185738 A1 * | 12/2002 | Kim et al. | 257/758 |
| 2004/0124477 A1 * | 7/2004 | Minami et al. | 257/379 |
| 2006/0267143 A1 * | 11/2006 | Sugimae et al. | 257/536 |

FOREIGN PATENT DOCUMENTS

JP 2002-110825 4/2002

\* cited by examiner

*Primary Examiner* — Anh Phung
*Assistant Examiner* — Allison P Bernstein
(74) *Attorney, Agent, or Firm* — Oblon, Spivak, McClelland, Maier & Neustadt, L.L.P.

(57) ABSTRACT

A nonvolatile semiconductor memory includes memory cell transistors and resistors. Each memory cell transistor has source/drain diffusion layers provided in a semiconductor substrate, a first gate insulating film located between the source/drain diffusion layers, a floating gate electrode layer located on the first gate insulating film, a first inter-gate insulating film located on the floating gate electrode layer, a control gate electrode layer located on the first inter-gate insulating layer, and a first low-resistance layer located on the control gate electrode layer. Each resistor has a second gate insulating film located on the semiconductor substrate, a first electrode layer located on the second gate insulating film, a second inter-gate insulating film located on the first electrode layer, a second electrode layer located on the second inter-gate insulating film, a second low-resistance layer located on the second electrode layer, and a contact plug connected to the second low-resistance layer.

17 Claims, 30 Drawing Sheets

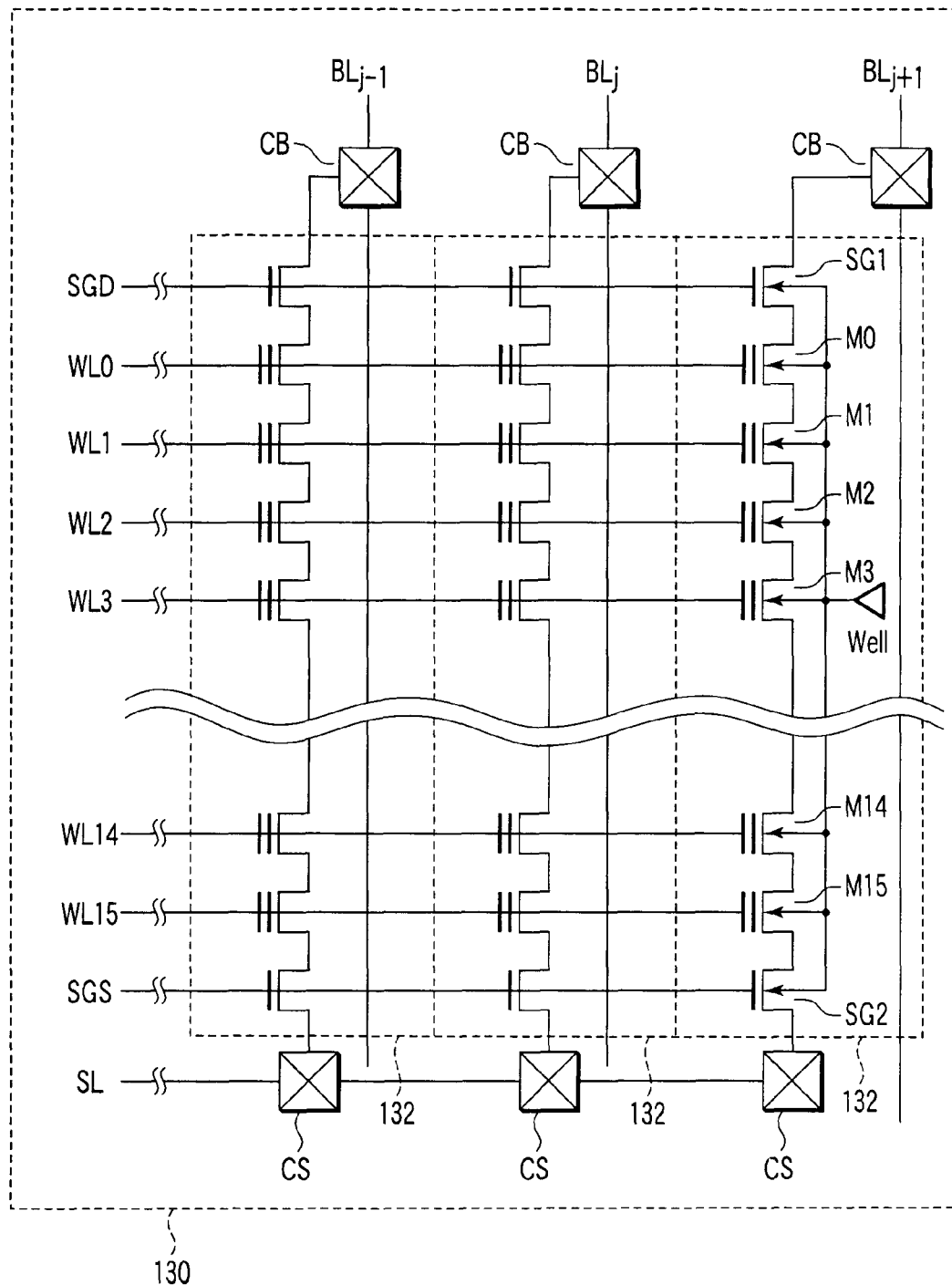
F I G. 17

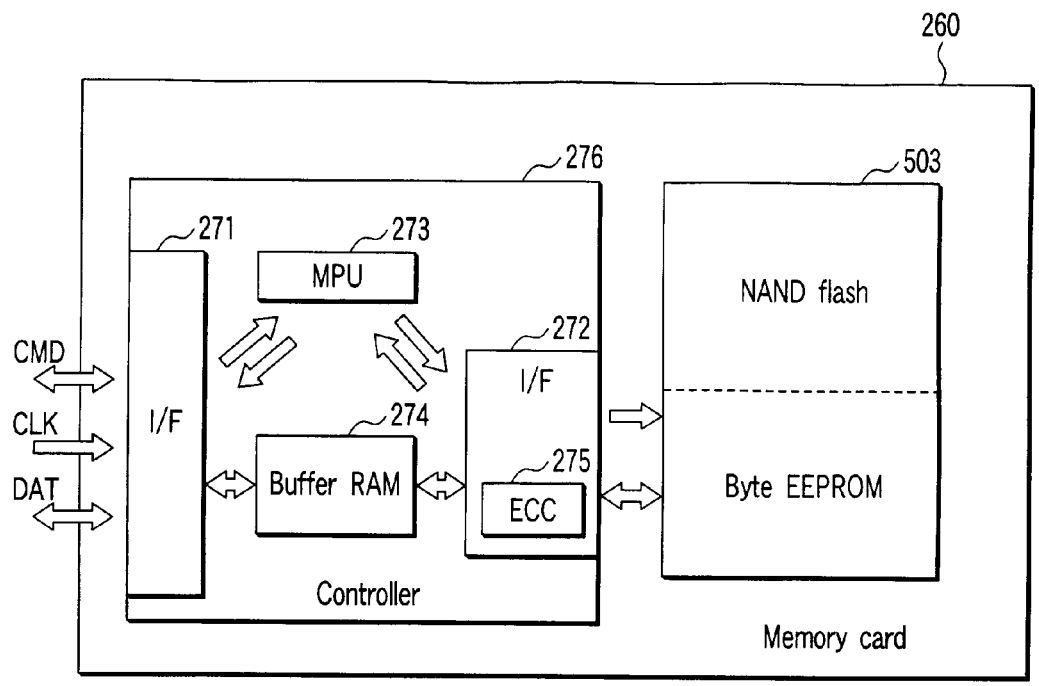
F I G. 27
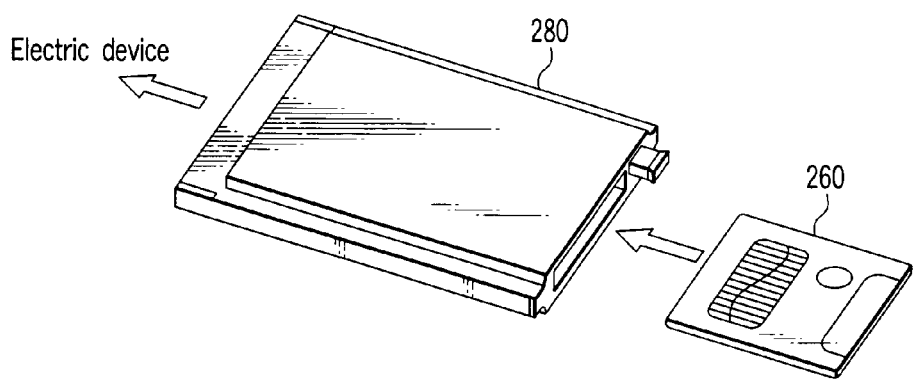
F I G. 28

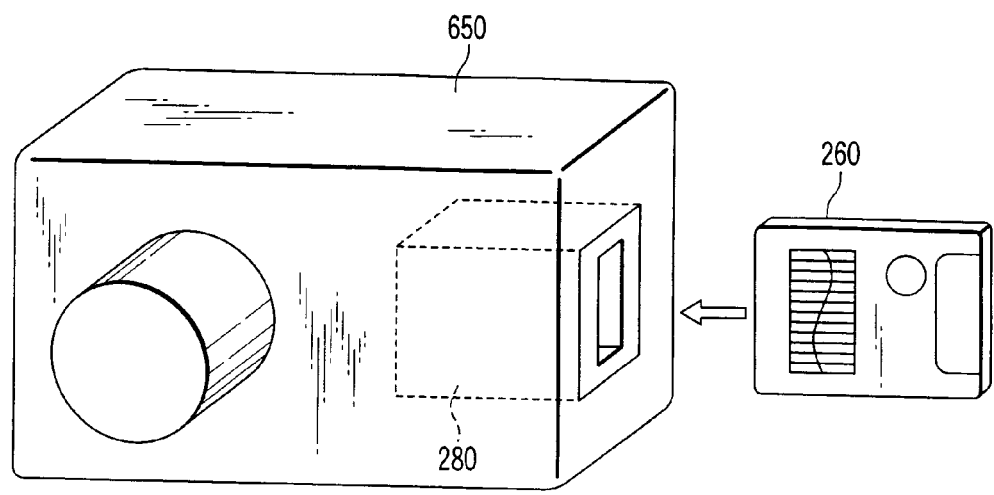
F I G. 31
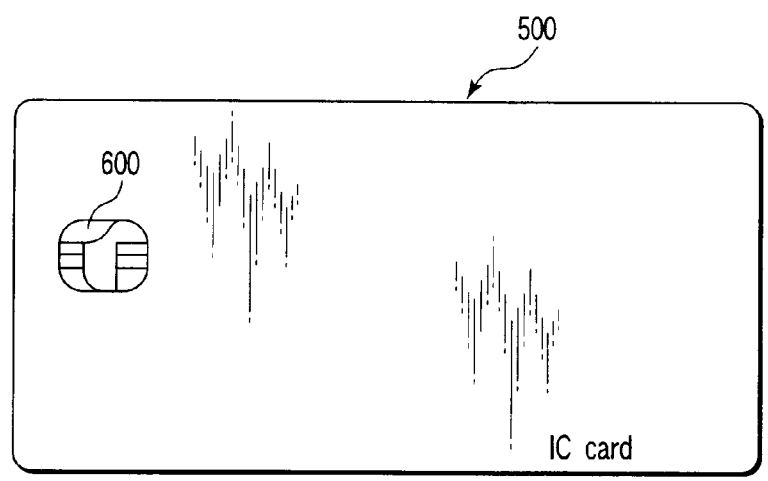
F I G. 32

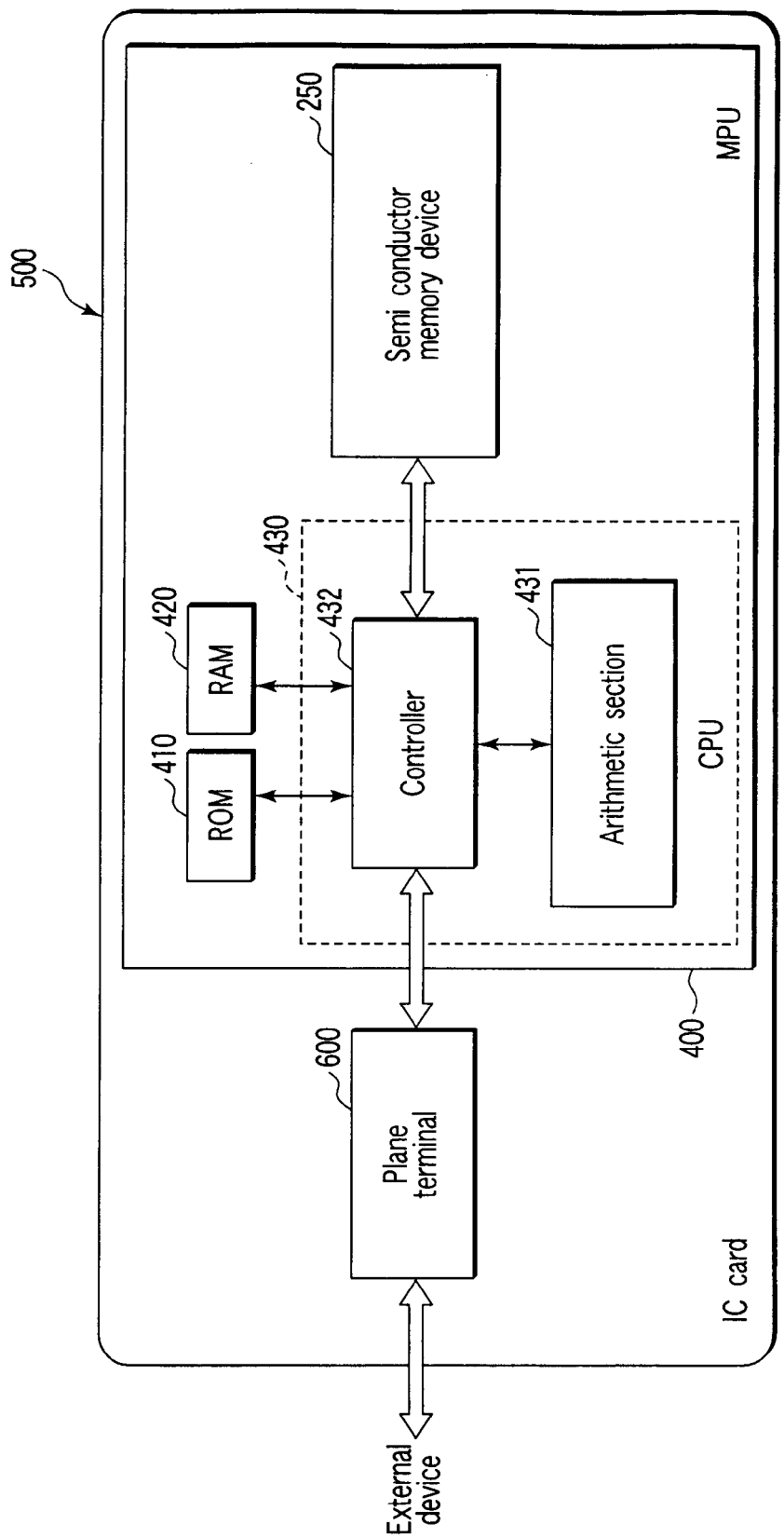
F I G. 33

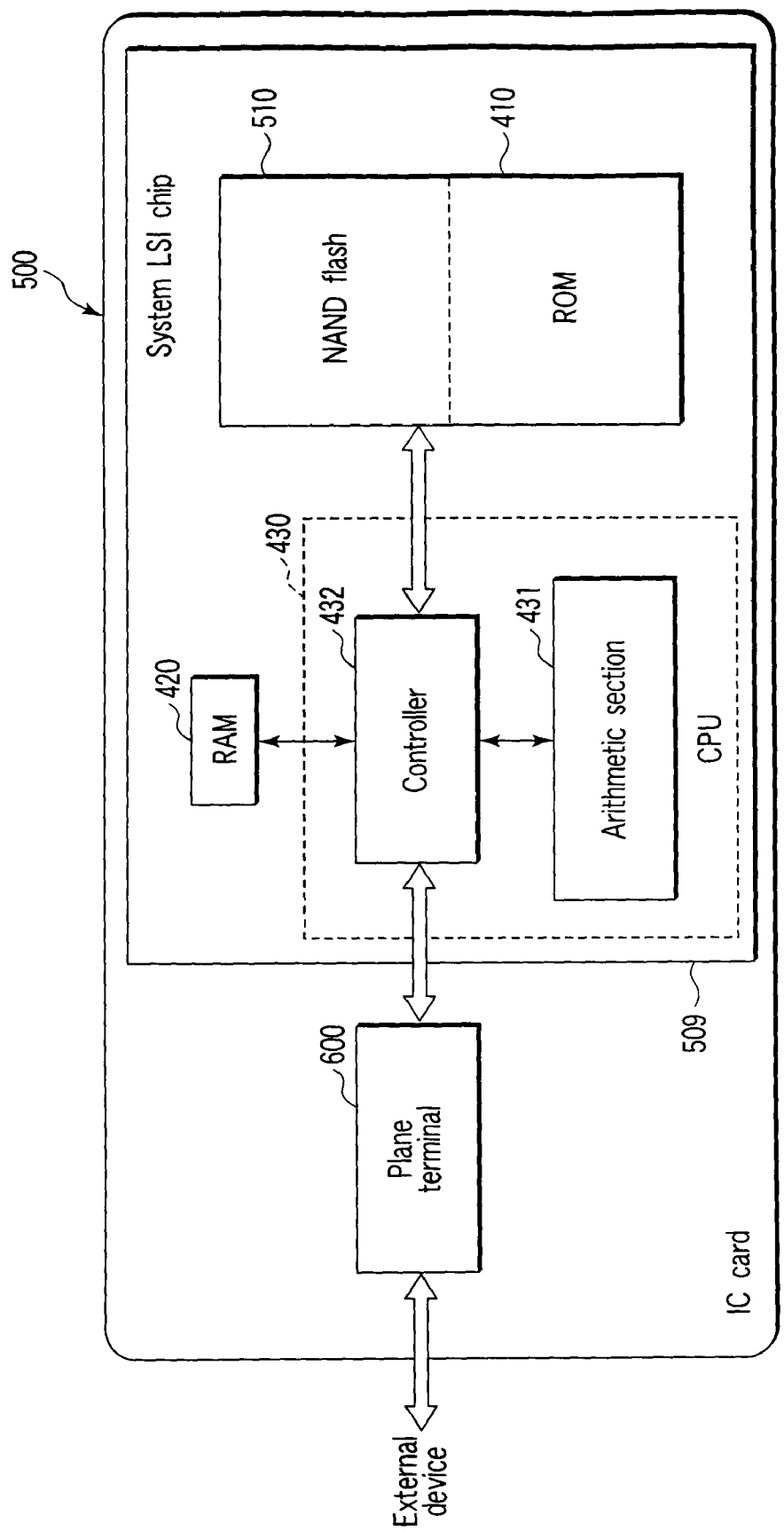
F I G. 35

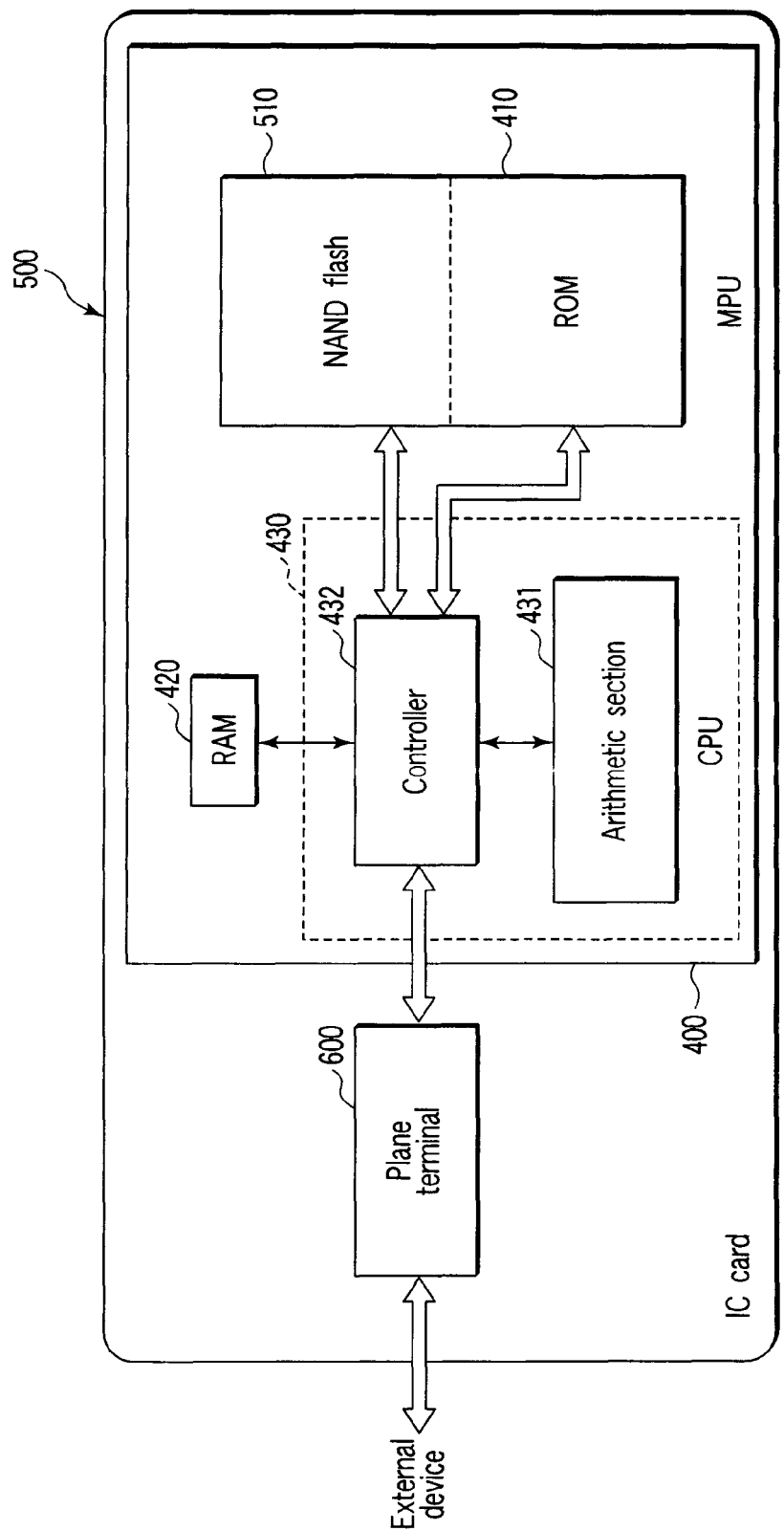
F I G. 36

NONVOLATILE SEMICONDUCTOR MEMORY HAS RESISTORS INCLUDING ELECTRODE LAYER FORMED ON LOW RESISTANCE LAYER ADJACENT TO MASK FILM

CROSS-REFERENCE TO RELATED APPLICATIONS

This application is based upon and claims the benefit of priority from prior Japanese Patent Application No. 2006-139353, filed May 18, 2006, the entire contents of which are incorporated herein by reference.

BACKGROUND OF THE INVENTION

1. Field of the Invention

The present invention relates to a nonvolatile semiconductor memory, and in particular, to resistors in a nonvolatile semiconductor memory having a stack structure and a method of manufacturing the resistive elements.

2. Description of the Related Art

Nonvolatile semiconductor memories use elements of a fixed resistance to generate internal voltages. For example, NAND flash memories use a polysilicon layer serving as a floating gate electrode layer, as a resistor.

As design rule dimensions decrease, the effect of, for example, a mutual interference resulting from the crosstalk between adjacent memory cell transistors becomes serious. Accordingly, to reduce the effect of such a mutual interference or the like, the floating gate electrode layer tends to have an increasingly reduced film thickness.

The reduced film thickness of the floating gate electrode layer significantly varies a resistance. The resistors elements may thus fail to provide appropriate functions, affecting circuit operations.

For example, a nonvolatile semiconductor memory has already been disclosed in which a gate oxide film material and a first gate electrode material (floating gate electrode layer) are sequentially deposited on a semiconductor substrate in this order, then an inter-gate insulating film material and a second gate electrode material (control gate electrode layer) are sequentially deposited on the first gate electrode in this order, and the second gate electrode material (control gate electrode layer) is formed into a resistor in a peripheral circuit portion (see, for example, Jpn. Pat. Appln. KOKAI Publication No. 2002-110825).

When the control gate electrode layer is used for the resistor, the resistor disadvantageously has an increased area if its resistance remains unchanged. This is because the control gate electrode layer comprises a stack structure of silicide with metal such as tungsten or cobalt and polysilicon and thus has a lower resistivity than the floating gate electrode layer.

BRIEF SUMMARY OF THE INVENTION

A nonvolatile semiconductor memory according to the present invention comprises: a plurality of memory cell transistors provided in a memory cell transistor region; and a plurality of resistors provided in a resistor region positioned around a periphery of the memory cell transistor region, wherein each memory cell transistor has: source/drain diffusion layers provided in a semiconductor substrate; a first gate insulating film located on the semiconductor substrate between the source/drain diffusion layers; a floating gate electrode layer located on the first gate insulating film; a first inter-gate insulating film located on the floating gate electrode layer; a control gate electrode layer located on the first inter-gate insulating layer; and a first low-resistance layer located on the control gate electrode layer, and each resistor has: second gate insulating film located on the semiconductor substrate; a first electrode layer located on the second gate insulating film; a second inter-gate insulating film located on the first electrode layer; a second electrode layer located on the second inter-gate insulating film; a mask film located on the second electrode layer; a second low-resistance layer located on the second electrode layer adjacent to the mask film, and wherein a first interlayer insulating film covers the memory cell transistor and the resistors, element, a second interlayer insulating film is located on the first low-resistance layer, the first interlayer insulating film, and the mask layer, and a contact plug located adjacent to the second interlayer insulating film and connected to the second low-resistance layer.

A method of manufacturing a nonvolatile semiconductor memory according to an aspect of the present invention comprises: sequentially forming, a first gate insulating film, a floating gate electrode layer, a first inter-gate insulating film, a control gate electrode layer, and a mask layer in a memory cell transistor region in which a plurality memory cell transistors are provided; simultaneously with the formation in the memory cell transistor region sequentially forming, a second gate insulating film being same as the first gate insulating film, a first electrode layer being same as the floating gate electrode layer, a second inter-gate insulating film being same as the first inter-gate insulating film, a second electrode layer being same as the control gate electrode layer, and a mask layer, in a resistor region positioned around a periphery of the memory cell transistor region; sequentially etching the first gate insulating film, the floating gate electrode layer, the first inter-gate insulating layer, the control gate electrode layer, and the mask film in the memory cell transistor region to form a stack gate electrode; forming source/drain diffusion layers in the semiconductor substrate in the memory cell transistor region in a self-aligning manner through the stack gate electrode as a mask; forming a first interlayer insulating film covering the entire memory transistor region and resistor region; etching the mask film on the control gate electrode layer in the memory cell transistor region to expose a surface of the control gate electrode layer, while simultaneously etching the mask film on the second electrode layer in the resistor region to form an opening to expose a part of a surface of the second electrode layer; forming the first and second low-resistance layers on the control gate electrode layer and the second electrode layer, respectively; forming a second interlayer insulating film on the first interlayer insulating film and the first and second low-resistance layers; and forming a contact plug in the second interlayer insulating film in the resistor region, the contact plug being connected to the second low-resistance layer.

BRIEF DESCRIPTION OF THE SEVERAL VIEWS OF THE DRAWING

FIG. 17 is a circuit diagram of a NAND memory cell array;

FIG. 27 is a block diagram of a memory card showing an application of the nonvolatile semiconductor memory;

FIG. 28 is a diagram of the configuration of an apparatus comprising a memory card and a card holder, showing an application of the nonvolatile semiconductor memory;

FIG. 31 is a diagram of the configuration of a system containing a memory card, showing an application of the nonvolatile semiconductor memory;

FIG. 32 is a diagram of the configuration of an IC card, showing an application of the nonvolatile semiconductor memory;

FIG. 33 is a diagram of the configuration of an IC card, showing an application of the nonvolatile semiconductor memory;

FIG. 35 is a diagram of the configuration of an IC card, showing an application of the nonvolatile semiconductor memory; and FIG. 36 is a diagram of the configuration of an IC card, showing an application of the nonvolatile semiconductor memory.

DETAILED DESCRIPTION OF THE INVENTION

Figure 1:
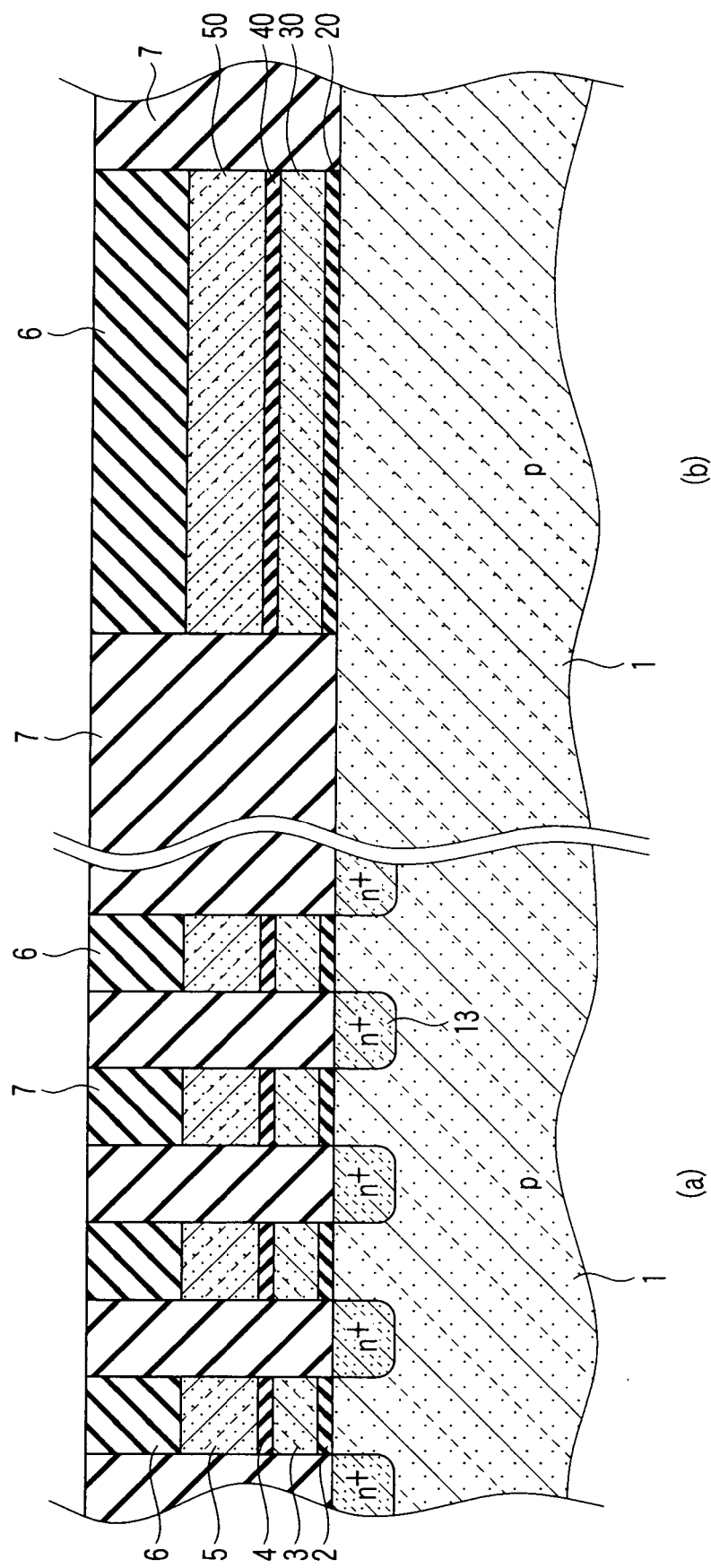
FIG. 1 is a sectional view showing a step of a manufacturing method in accordance with a first embodiment.

Now, a first embodiment to an eighth embodiment of the present invention will be described with reference to the drawings. In the description below of the drawings, the same or similar parts are denoted by the same or similar reference numerals. However, it should be noted that the drawings are schematic and that the relationship between thickness and planar dimensions, the ratio of the thicknesses of layers, and the like are different from actual ones. Accordingly, specific thickness and other dimensions should be determined taking the description below into account. Further, of course, the drawings themselves contain different dimensional relationships and different ratios.

[First Embodiment]

In a nonvolatile semiconductor memory in accordance with a first embodiment of the present invention, a memory cell transistor region is based on the structure of a NAND flash memory and constitutes a NAND memory cell array.

Figure 4:
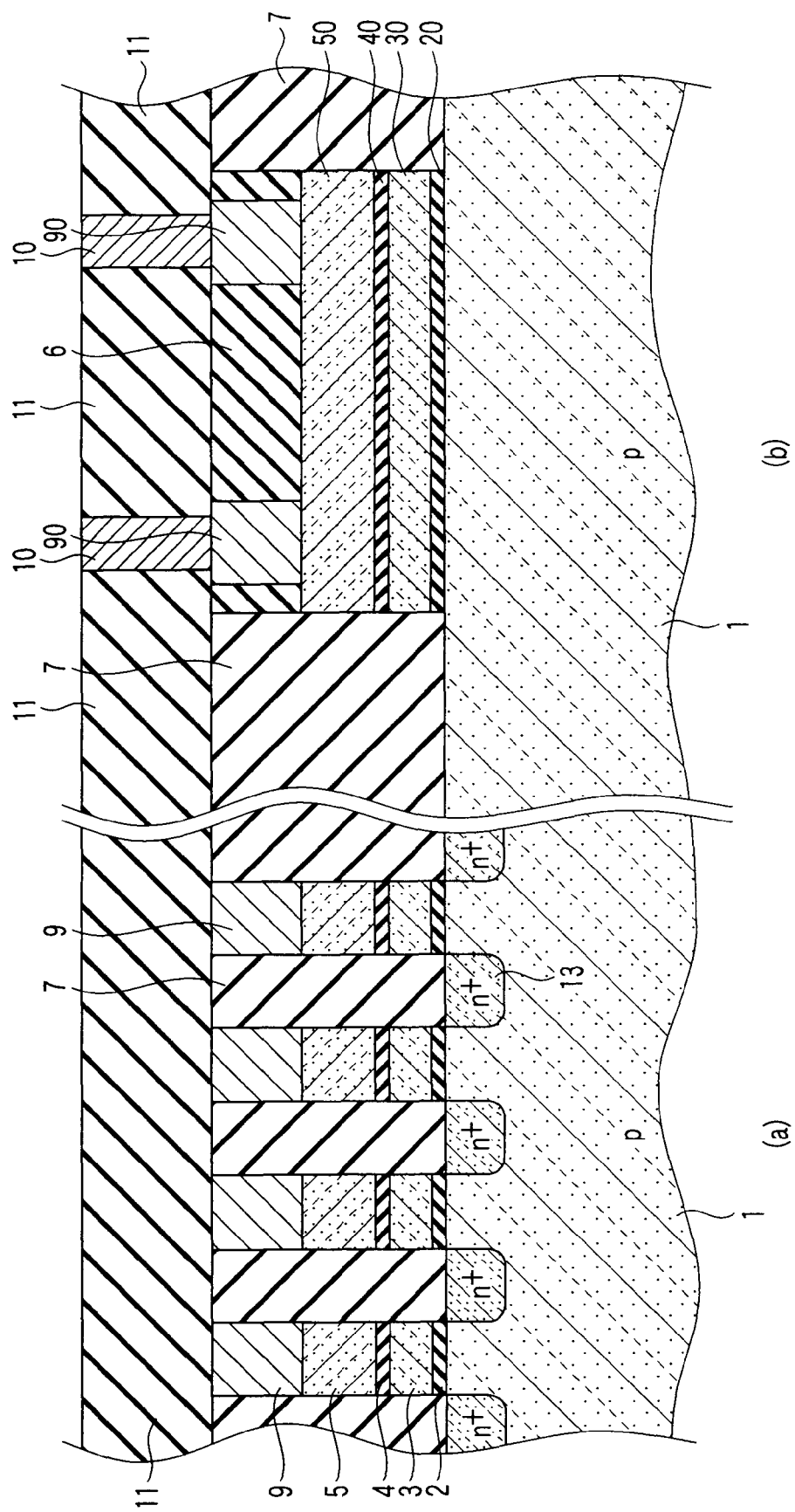
FIG. 4 is a sectional view showing a step of the manufacturing method in accordance with the first embodiment.

FIG. 4 shows a sectional structure of a nonvolatile semiconductor memory in accordance with the present embodiment.

The nonvolatile semiconductor memory in accordance with the first embodiment of the present invention comprises a memory cell transistor region separated into elements in a p well or semiconductor substrate 1 in a row direction, the elements being arranged in series in a column direction, as shown in FIG. 4(a), and a resistor region located on the p well or semiconductor substrate 1 as shown in FIG. 4(b).

As shown in FIG. 4(a), a plurality of memory cell transistors are provided in the memory cell transistor region. Each memory cell transistor comprises $n^+$ source/drain diffusion layers 13, a first gate insulating film 2 located on the p well or semiconductor substrate 1 between the $n^+$ source/drain diffusion layers 13, a floating gate electrode layer 3 located on the gate insulating film 2, an first inter-gate insulating film 4 located on the floating gate electrode layer 3, a control gate electrode layer 5 located on the inter-gate insulating film 4, and a first low-resistance layer 9 located on the control gate electrode layer 5. The memory cell transistor further comprises first interlayer insulating films 7 each insulating stack gate structures from each other, the stack gate structures each comprising the floating gate electrode layer 3, the inter-gate insulating film 4, the control gate electrode layer 5, and the first low resistance layer 9 to provide each memory cell transistor, and a second interlayer insulating film 11 located on the first low-resistance layer 9 and the first interlayer insulating film 7.

On the other hand, the resistor region has at least one resistor. As shown in FIG. 4(b), each resistor comprises a second gate insulating film 20 located on the p well or semiconductor substrate 1, a first electrode layer 30 located on the gate insulating film 20, the second inter-gate insulating film 40 located on the first electrode layer 30, a second electrode layer 50 located on the inter-gate insulating film 40, a nitride film 6 located on the second electrode layer 50 as a mask film, and a second low-resistance layer 90 located on the second electrode layer 50 adjacent to the nitride film 6. The resistor region further comprises first interlayer insulating films 7 each insulating stack structures from each other, the stack structures each comprising the first electrode layer 30, the inter-gate insulating film 40, the second electrode layer 50, the second low-resistance layer 90, and the nitride film 6 to provide each resistor, a second interlayer insulating film 11 located on the second low-resistance layer 90, the first interlayer insulating film 7, and the nitride film 6, and contact plugs 10 located adjacent to the second interlayer insulating film 11 and connected to the second low-resistance layer 90.

The nonvolatile semiconductor memory in accordance with the present embodiment uses the second electrode layer 50 of the stack structure in the resistor region as a resistor as shown in FIG. 4(*b*).

In the nonvolatile semiconductor memory in accordance with the present embodiment, the floating gate electrode layer 3 and the first electrode layer 30, formed simultaneously with the formation of the floating gate electrode layer 3, are thinned as shown in FIGS. 4(*a*) and 4(*b*). This enables a reduction in the height of steps in the stack gate structure.

Thus, the second electrode layer 50, formed simultaneously with the formation of the control gate electrode layer 5, need not be thinned as much as the first electrode layer 30. This allows the second electrode layer 50 to be thicker than the first electrode layer. Therefore, fabrication of a resistor using the second electrode layer 50 provides a stable resistance without the need to add steps.

In the nonvolatile semiconductor memory in accordance with the present embodiment, the control gate electrode layer 5 and the second electrode layer 50, formed simultaneously with the formation of the control gate electrode layer 5 are polysilicon layers having a higher resistivity than metal silicide. This enables a reduction in the area of the resistor region. The material of the control gate electrode layer is not limited to polysilicon. Any conductive material having a higher resistivity than the metal silicide may be used.

(Manufacturing Method)

FIGS. 1 to 4 show a method of manufacturing a nonvolatile semiconductor memory in accordance with a first embodiment of the present invention. FIGS. 1(*a*) to 4(*a*) are sectional views of a memory cell transistor region in a NAND flash memory in which the memory cell transistor region extends in a direction perpendicular to gate electrodes, that is, the column direction. FIGS. 1(*b*) to 4(*b*) are schematic sectional views of the resistor region, located around the periphery of the memory transistor region.

First, as shown in FIGS. 1(*a*) and 1(*b*), an isolation layer (not shown) is formed in an isolation region in the p well or semiconductor substrate 1 using a normal manufacturing method.

Then, a gate insulating film 2, a floating gate electrode layer 3, an inter-gate insulating film 4, a control gate electrode layer 5, and a nitride film 6 as a mask film are sequentially formed on the p well or semiconductor substrate 1 in the memory cell transistor region so as to form a stack gate structure during gating. Here, the floating gate electrode layer 3 and the control gate electrode layer 5 are, for example, polysilicon layers.

Simultaneously with the formation of the memory cell transistor region, a gate insulating film 20, a first electrode layer 30, a inter-gate insulating film 40, a second electrode layer 50, and a nitride film 6 as a mask film are sequentially formed in the resistor region shown in FIG. 1(*b*) on the p well or semiconductor substrate 1; each of the films is formed simultaneously with the corresponding film in the memory cell transistor region.

In the memory cell region, gating is executed so as to form the floating gate electrode layer 3, the inter-gate insulating film 4, the control gate electrode layer 5, and the nitride film 5 into a stack gate structure. Subsequently, in the memory cell region, n+ source/drain diffusion layers 13 are formed in the p well or semiconductor substrate 1 in a self-aligning manner.

A first interlayer insulating film 7 is formed all over the memory cell transistor region and resistor element region by deposition. The resulting surface is flattened by, for example, chemical mechanical polishing (CMP).

Here, the stack gate structure comprises the gate electrode layer 2, the polysilicon layer as the floating gate electrode layer 3, the inter-gate insulating film 4, the polysilicon layer as the control gate electrode layer 5, and the nitride film 6, and contains no metal layer. This also applies to the stack in the resistor region, formed simultaneously with the formation of the stack gate structure.

Figure 2:
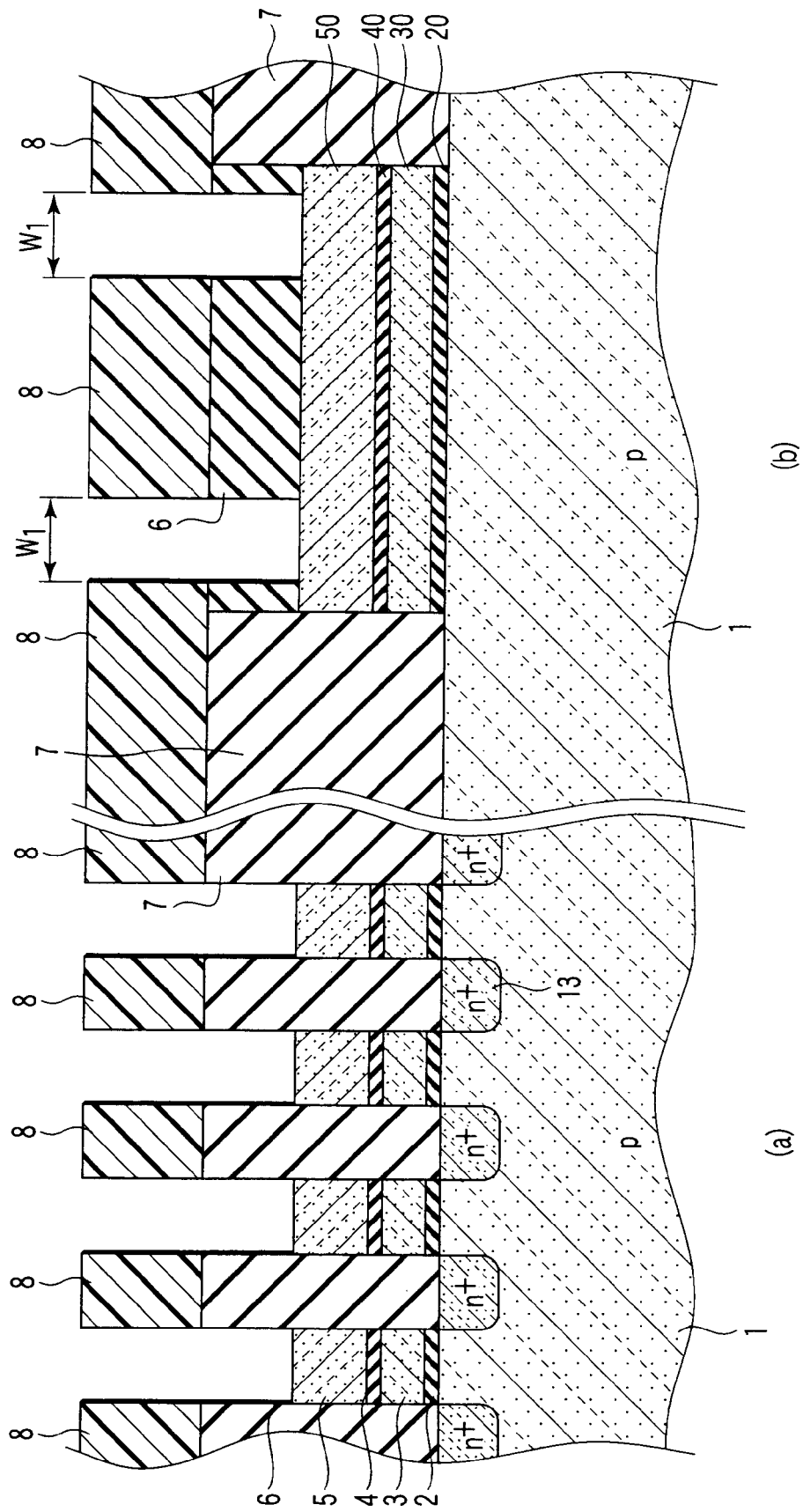
FIG. 2 is a sectional view showing a step of the manufacturing method in accordance with the first embodiment.

Then, as shown in FIGS. 2(*a*) and 2(*b*), a photoresist layer 8 is formed all over the surface by deposition. To form, during the subsequent step, a low-resistance layer composed of silicide with metal such as cobalt or nickel on the control gate electrode layer 5 and second electrode layer 50, composed of polysilicon, the nitride film on the control gate electrode layer 5 and second electrode layer 50 is etched away through the photoresist layer 8 as a mask.

As s result, in the memory cell transistor region, the nitride film 6 is etched with the control gate electrode layer 5 exposed, as shown in FIG. 2(*a*). In the resistor region, the nitride film 6 is etched only in the area in which the second low-resistance layer is formed, by a pattern width $W_1$ to expose the second electrode layer 50.

Thus, the present embodiment uses, as a resistor, the second electrode layer 50, composed of a polysilicon, having a higher resistivity than metal silicide. This allows a required resistance to be obtained with a reduced occupation area. In this case, the optimum resistance for the resistor can be accurately obtained by varying the area of a stack structure portion including the second low-resistance layer and the second electrode layer.

Figure 3:
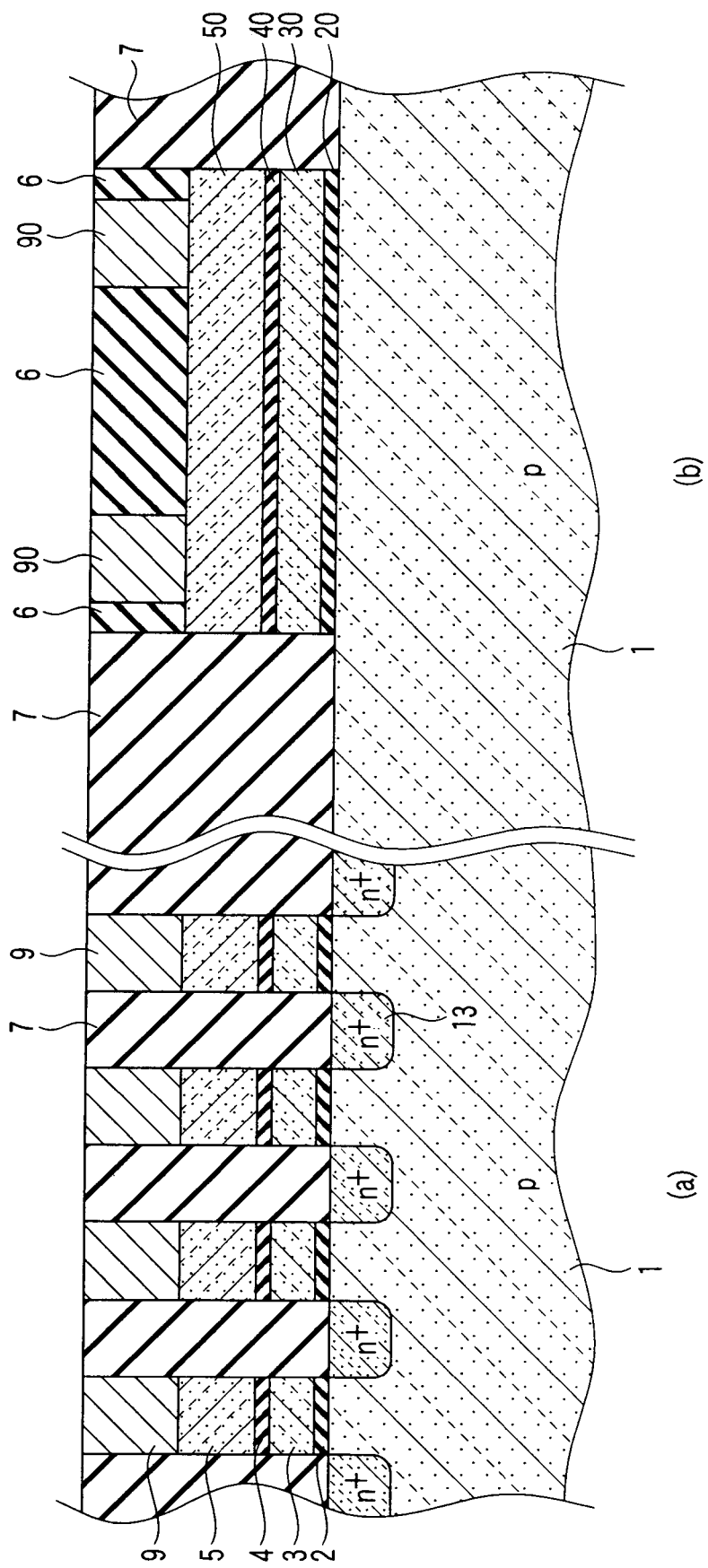
FIG. 3 is a sectional view showing a step of a manufacturing method in accordance with the first embodiment.

Then, as shown in FIG. 3(*a*), in the memory cell transistor region, metal such as cobalt or nickel is deposited on the control gate electrode layer 5. A thermal treatment is then performed to silicidize the control gate electrode layer 5, composed of polysilicon, to form a first low-resistance layer 9 composed of metal silicide. At the same time, as shown in FIG. 3(*b*), in the resistor region, metal such as cobalt or nickel is deposited on the second electrode layer 50. A thermal treatment is then performed to silicidize a part of the second electrode layer 50, composed of polysilicon, to form a second low-resistance layer 90 composed of metal silicide.

Then, as shown in FIG. 4(*a*), in the memory cell transistor region, a second interlayer insulating film 11 is formed on the first interlayer insulating film 7 and the first low-resistance layer 9 by deposition. At the same time, in the resistor region, a second interlayer insulating film 11 is formed on the first interlayer insulating film 7, the nitride film 6, and the second low-resistance layer 90 by deposition as shown in FIG. 4(*b*).

Then, the resulting surface is flattened by CMP or the like, and contact plugs to be connected to the second low-resistance layer 90 are then formed in the second interlayer insulating film 11 by photolithography or the like. The subsequent steps are the same as normal steps of forming a interconnect layer and will thus not be described.

According to the nonvolatile semiconductor memory and the method of manufacturing the nonvolatile semiconductor memory in accordance with the first embodiment of the present invention, the second electrode layer 50, formed simultaneously with the formation of the control gate electrode layer 5, is used to make a resistor. This provides a stable resistance without the need to add steps.

Further, the resistor is formed only of the second electrode layer 50, composed of polysilicon and formed simultaneously with the formation of the control gate electrode layer 5. This allows the resistor to be made of the material with a high resistivity, enabling a reduction in the occupation area of the resistor.

[Second Embodiment]

Also in a nonvolatile semiconductor memory in accordance with a second embodiment of the present invention, the memory cell transistor region is based on the structure of a NAND flash memory.

Figure 8:
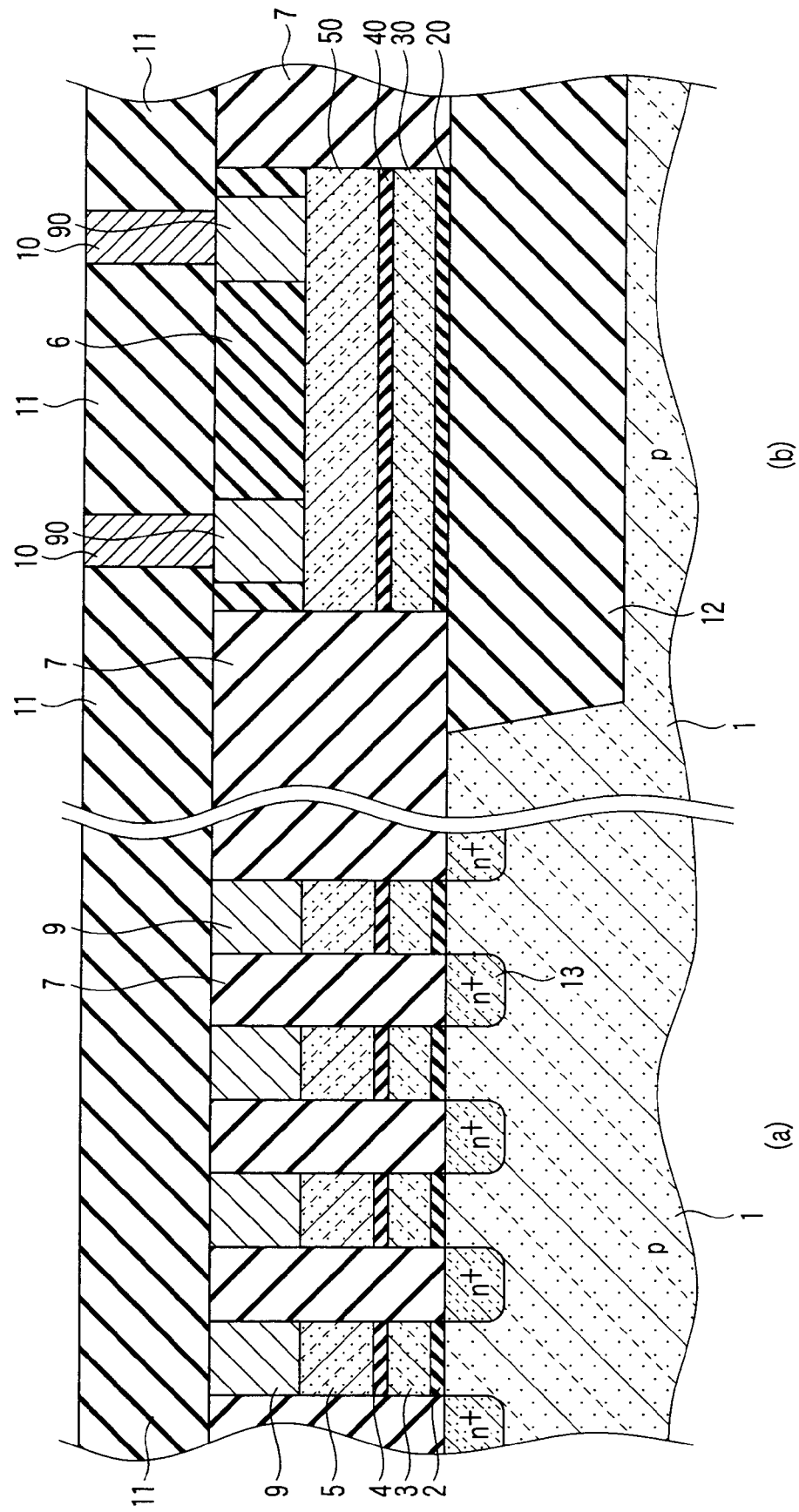
FIG. 8 is a sectional view showing a step of the manufacturing method in accordance with the second embodiment.

FIG. 8 shows a sectional view of the nonvolatile semiconductor memory in accordance with the present embodiment.

As shown in FIG. 8(a), the nonvolatile semiconductor memory in accordance with the present embodiment comprises a memory cell transistor region separated into elements in the p well or semiconductor substrate 1 in the row direction, the elements being arranged in series in the column direction, and a resistor region located on an isolation region (STI) located in the p well or semiconductor substrate 1 as shown in FIG. 8(b).

The memory cell transistor region is similar to that in the first embodiment, shown in FIG. 4(a), and will thus not be described.

As shown in FIG. 8(b), the resistor region comprises the gate electrode layer 20 located on the isolation layer 12, formed in the p well or semiconductor substrate 1, the first electrode layer 30, located on the gate insulating film 20, the inter-gate insulating film 40, located on the first electrode layer 30, the second electrode layer 50, formed on the inter-gate insulating film 40, the nitride film 6 as a mask film, located on the second electrode layer 50, and the second low-resistance layer 90, located on the second electrode layer 50 adjacent to the nitride film 6. The resistor region further comprises the first interlayer insulating film 7, insulating stack structures from each other, the second interlayer insulating film 11, located on the second low-resistance layer 90, the first interlayer insulating film 7, and the nitride film 6, and the contact plugs 10, connected to the second low-resistance layer 90.

In the nonvolatile semiconductor memory in accordance with the present embodiment, the resistor is formed on the isolation layer 12, formed in the p well or semiconductor substrate 1 as shown in FIG. 8(b). This enables a reduction in the parasitic capacitor of the resistor region to improve the high frequency characteristic of the resistor.

Also in the present embodiment, the second electrode layer 50 in the resistor region is composed of polysilicon and used as a resistor as in the case of the first embodiment.

In the nonvolatile semiconductor memory in accordance with the present embodiment, the floating gate electrode layer 3 and the first electrode layer 30, formed simultaneously with the formation of the floating gate electrode layer 3, are thinned as shown in FIGS. 8(a) and 8(b). This enables a reduction in the height of steps in the stack gate structure.

Thus, the second electrode layer 50, formed simultaneously with the formation of the control gate electrode layer 5, need not be thinned as much as the first electrode layer 30.

Therefore, fabrication of a resistor using the second electrode layer 50 provides a stable resistance without the need to add steps.

Further, in the nonvolatile semiconductor memory in accordance with the present embodiment, the control gate electrode layer 5 and the second electrode layer 50, formed simultaneously with the formation of the control gate electrode layer 5, are both made of polysilicon, having a higher resistivity than metal silicide. This enables a reduction in the area of the resistor.

(Manufacturing Method)

FIGS. 5 to 8 show a method of manufacturing a nonvolatile semiconductor memory in accordance with a second embodiment of the present invention. FIGS. 5(a) to 8(a) are sectional views of a memory cell transistor region in a NAND flash memory in which the memory cell transistor region extends in a direction perpendicular to gate electrodes, that is, the column direction. FIGS. 5(b) to 8(b) are sectional views of the resistor region, located around the periphery of the memory transistor region.

First, as shown in FIGS. 5(a), an isolation layer (not shown) is formed in the memory cell transistor region of the p well or semiconductor substrate 1. Further, a gate insulating film 2, a floating gate electrode layer 3, an inter-gate insulating film 4, a control gate electrode layer 5, and a nitride film 6 as a mask film are sequentially formed on the p well or semiconductor substrate 1; the films and layers collectively constitute a stack gate structure. Here, the floating gate electrode layer 3 and the control gate electrode layer 5 are, for example, polysilicon layers.

As shown in FIG. 5(b), simultaneously with the formation of the memory cell transistor region, an isolation layer 12 is formed in the resistor region of the p well or semiconductor.

Then a gate insulating film 20, a first electrode layer 30, a inter-gate insulating film 40, a second electrode layer 50, and a nitride film 6 as a mask film are sequentially formed in the resistor region on the isolation layer 12.

In the memory cell region, gating is executed so as to form the floating gate electrode layer 3, the inter-gate insulating film 4, the control gate electrode layer 5, and the nitride film 6 into a stack gate structure. Subsequently, n+ source/drain diffusion layers 13 are formed in the p well or semiconductor substrate 1 through the stack gate as a mask.

A first interlayer insulating film 7 is formed all over the memory cell transistor region and resistor region by deposition. The resulting surface is flattened by CMP.

Here, the stack gate structure comprises the gate insulating film 2, the polysilicon layer as the floating gate electrode layer 3, the inter-gate insulating film 4, the polysilicon layer as the control gate electrode layer 5, and the nitride film 6, and contains no metal layer. This also applies to the stack in the resistor region, formed simultaneously with the formation of the stack gate structure.

Then, as shown in FIGS. 6(a) and 6(b), a photoresist layer 8 is formed. To form, during the subsequent step, a low-resistance layer composed of silicide with metal such as cobalt or nickel on the control gate electrode layer 5 and second electrode layer 50, composed of polysilicon, the nitride film on the control gate electrode layer 5 and second electrode layer 50 is etched away through the photoresist layer 8 as a mask.

As s result, in the memory cell transistor region, the nitride film on the control gate electrode layer 5 is etched with the control gate electrode layer 5 exposed, as shown in FIG. 6(a). In the resistor region, the nitride film is etched only in the area in which the low-resistance layer is formed, by the pattern width $W_1$ to expose the second electrode layer 50.

Thus, the present embodiment uses, as a resistor, the second electrode layer 50, composed of polysilicon, has a higher resistivity than metal silicide. This allows a required resistance to be obtained with a reduced occupation area. In this case, the optimum resistance for the resistor can be accurately obtained by varying the area of a stack structure portion including the second low-resistance layer 90, to which the contact plugs 10 are connected, and the second electrode layer 50.

Then, the photoresist layer is removed. Then, as shown in FIG. 7(a), in the memory cell transistor region, metal such as cobalt or nickel is deposited on the control gate electrode layer 5. A thermal treatment is then performed to silicidize the control gate electrode layer 5, composed of polysilicon, to form a first low-resistance layer 9. At the same time, as shown in FIG. 7(b), in the resistor region, metal such as cobalt or nickel is deposited on the second electrode layer 50. A thermal treatment is then performed to silicidize a part of the second electrode layer 50, composed of polysilicon, to form a second low-resistance layer 90.

Then, as shown in FIG. 8(a), in the memory cell transistor region, a second interlayer insulating film 11 is formed on the first interlayer insulating film 7 and the first low-resistance layer 9 by deposition. At the same time, in the resistor region, a second interlayer insulating film 11 is formed on the first interlayer insulating film 7, the nitride film 6, and the second low-resistance layer 90 by deposition as shown in FIG. 8(b).

Then, the resulting surface is flattened by CMP or the like, and contact plugs to be connected to the second low-resistance layer 90 are then formed in the second interlayer insulating film 11 by photolithography or the like. The subsequent steps are the same as normal steps of forming a interconnect layer and will thus not be described.

According to the nonvolatile semiconductor memory and the method of manufacturing the nonvolatile semiconductor memory in accordance with the second embodiment of the present invention, the second electrode layer 50, formed simultaneously with the formation of the control gate electrode layer 5, is used to make a resistor. This provides a stable resistance without the need to add steps.

Further, the resistor is formed only of the second electrode layer 50, formed simultaneously with the formation of the control gate electrode layer 5, composed of polysilicon. This allows the resistor to be made of the material with a high resistivity, enabling a reduction in the occupation area of the resistor.

Moreover, in the nonvolatile semiconductor memory in accordance with the second embodiment of the present invention, the resistor region is formed on the isolation region 12, formed in the p well or semiconductor substrate 1. This enables a reduction in the parasitic capacitor of the resistor region, improving the high frequency characteristic of the resistor.

(Example of Planar Pattern of the Resistor)

Figure 9:
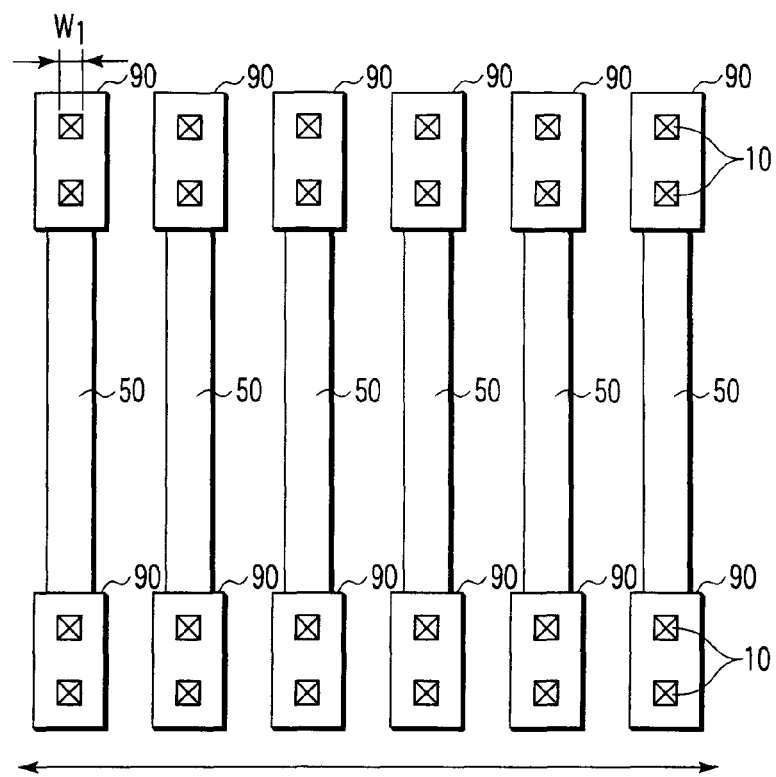
FIG. 9 is a plan view of a resistor region in accordance with the first and second embodiments.

In a nonvolatile semiconductor memory in accordance with the first and second embodiments of the present invention, the planar pattern configuration of the resistor region comprises the second electrode layer 50, the second low-resistance layer 90, formed on the second electrode layer 50, and the contact plugs 10, connected to the second low-resistance layer 90, as shown in FIG. 9. In the example shown in FIG. 9, the two contact plugs 10 are located in each low-resistance layer 90.

In the planar pattern configuration of the resistor region of the nonvolatile semiconductor memory in accordance with the first and second embodiments, six second electrode layers 50 are arranged parallel to one another in a stripe pattern, and each have, at its opposite ends, the low-resistance layer 90 and the contact plugs 10 connected to the low-resistance layer 90, as shown in FIG. 9.

The planar pattern in FIG. 9 corresponds substantially to the schematic sectional structure of the resistor region indicating that a nonvolatile semiconductor memory in accordance with the first and the second embodiment.

Figure 10:
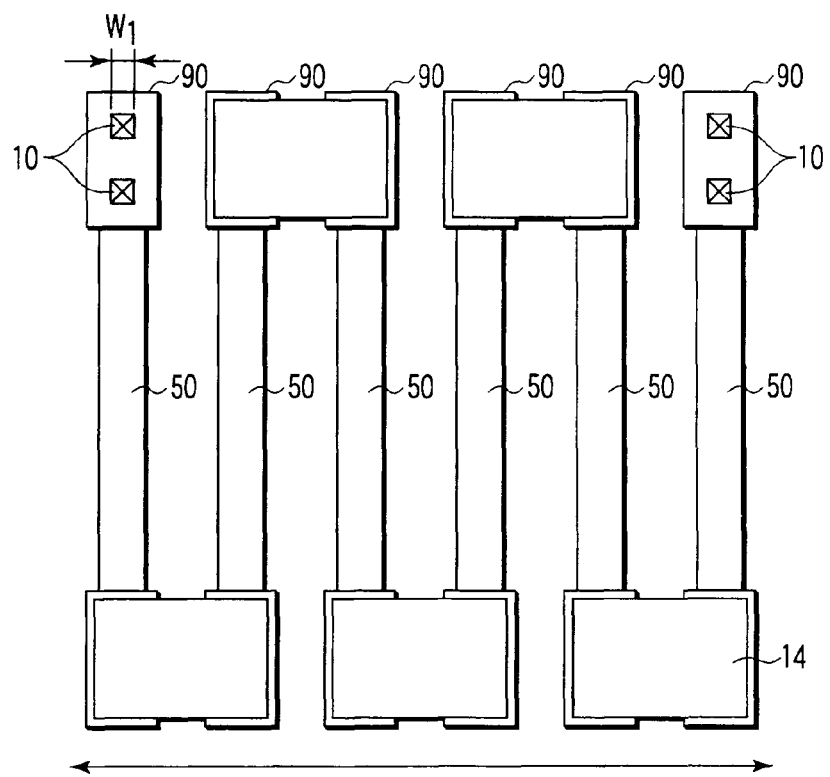
FIG. 10 is a plan view of a resistor region in accordance with the first and second embodiments.

Further, in a step of the method of manufacturing a nonvolatile semiconductor memory in accordance with the first and second embodiments, the planar pattern of the resistor region in which the interconnect layer 14 has been formed is as shown in FIG. 10. That is, the planar pattern comprises the second electrode layer 50, the second low-resistance layer 90, formed on the second electrode layer 50, the contact plugs 10, connected to the low-resistance layer 90, and the interconnect layer 14, located on the contact plug 10. In the example shown in FIG. 10, the interconnect layer 14, connected to the contact plugs 10, is arranged so that six resistors are connected in series.

In the resistor region of the nonvolatile semiconductor memory in accordance with the first and second elements may include a plurality of resistors having one of the planar pattern configurations shown in FIGS. 9 and 10 as a basic pattern.

[Third Embodiment]

Also in a nonvolatile semiconductor memory in accordance with a third embodiment of the present invention, the memory cell transistor region is based on the structure of a NAND flash memory.

Figure 13:
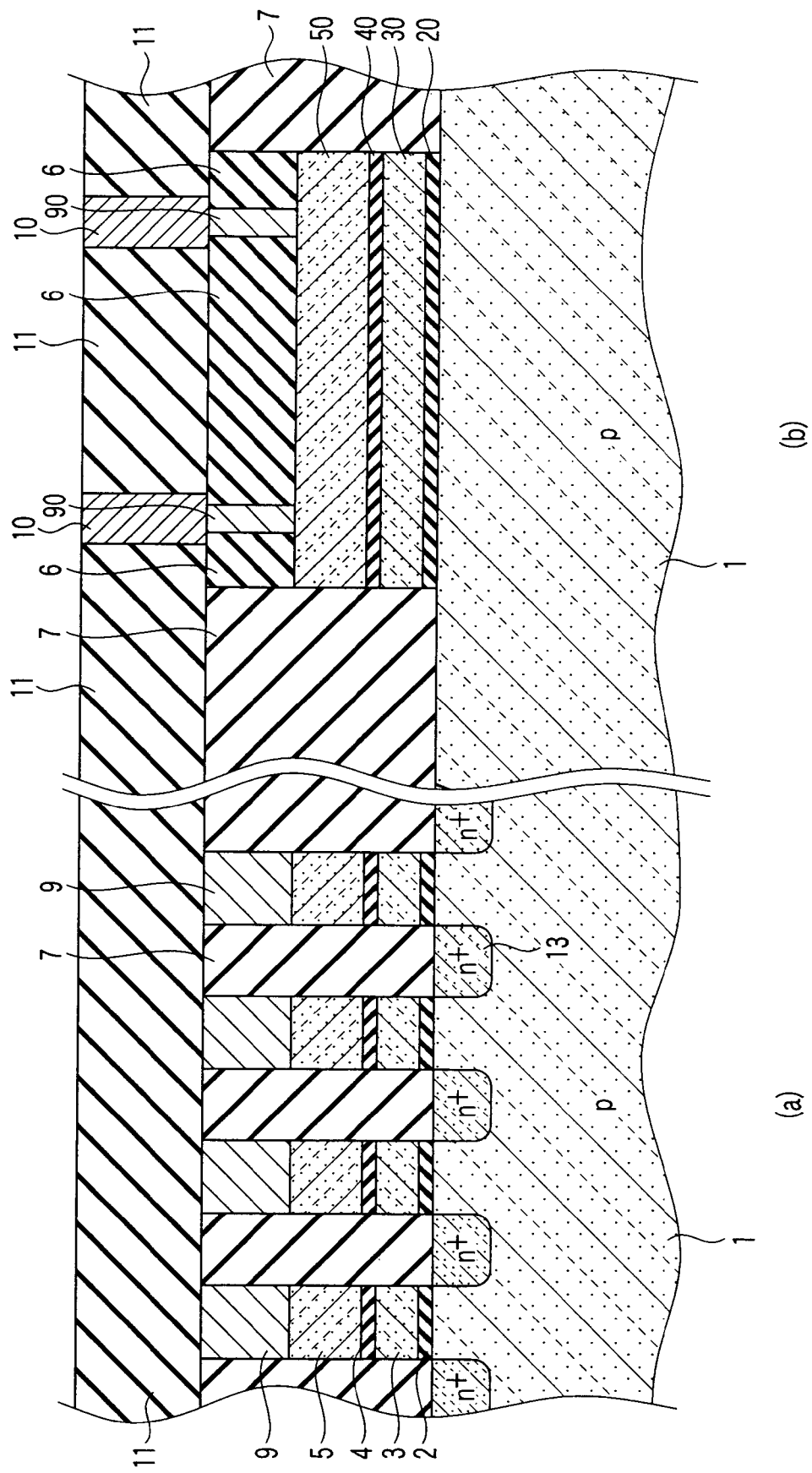
FIG. 13 is a sectional view showing a step of a manufacturing method in accordance with the third embodiment.

FIG. 13 is a sectional view of the nonvolatile semiconductor memory in accordance with the present embodiment.

As shown in FIG. 13(a), the nonvolatile semiconductor memory in accordance with the present embodiment comprises a memory cell transistor region separated into elements in the p well or semiconductor substrate 1 in the row direction, the elements being arranged in series in the column direction, as shown in FIG. 13(a), and a resistor region located on the p well or semiconductor substrate 1 as shown in FIG. 13(b).

The configuration of the memory cell transistor region is similar to that in the first embodiment, shown in FIG. 4(a), or in the second embodiment, shown in FIG. 8(a), and will thus not be described. The resistor region also has a configuration similar to that in the first embodiment, shown in FIG. 4(b), and its components will thus not be described in detail.

Figure 11:
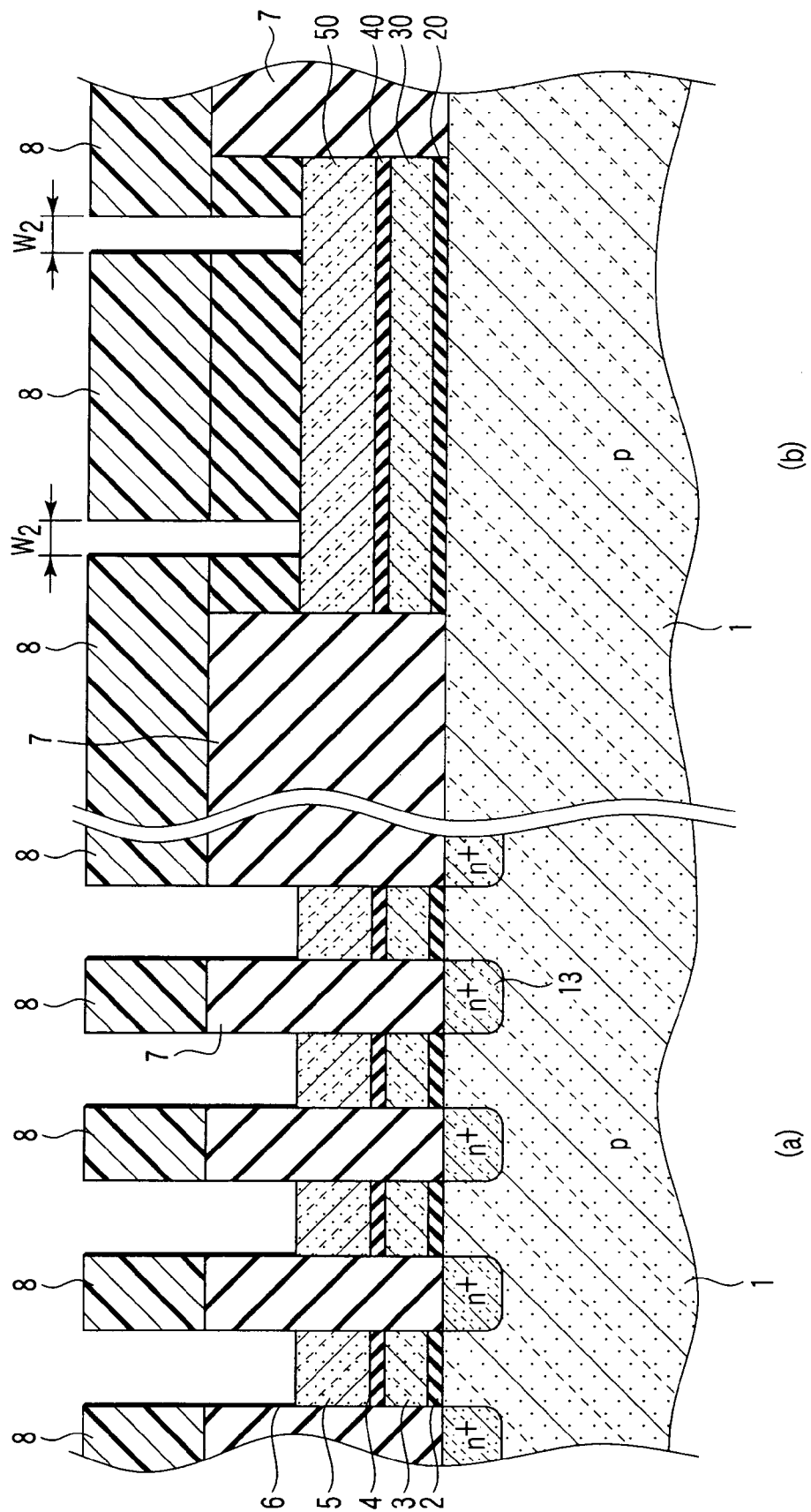
FIG. 11 is a sectional view showing a step of a manufacturing method in accordance with a third embodiment.

The third embodiment is different from the first embodiment in that a pattern width $W_2$ with which the second low-resistance layer 90 is formed is smaller than the pattern width $W_1$ with which the second low-resistance layer is formed in accordance with the first embodiment, that is, $W_2 < W_1$, as shown in FIG. 11(b).

Figure 12:
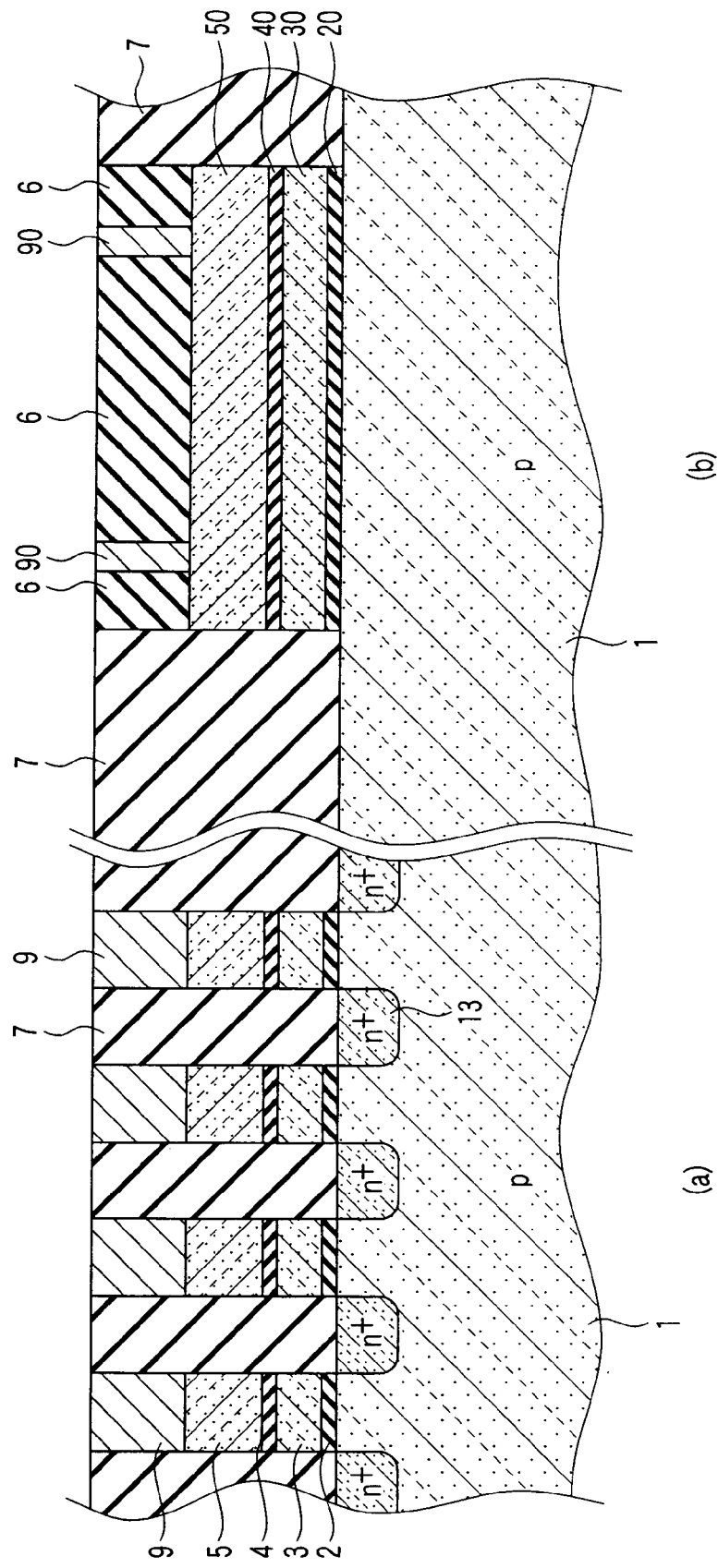
FIG. 12 is a sectional view showing a step of the manufacturing method in accordance with the third embodiment.

This setting enables a reduction in the contact area between the second low-resistance layer 90 and the second electrode layer 50 as shown in FIG. 12(b). This in turn enables a further increase in resistance.

In the nonvolatile semiconductor memory in accordance with the present embodiment, the second electrode layer 50, composed of polysilicon, is used as a resistor in the resistor region as shown in FIG. 13(b).

In the nonvolatile semiconductor memory in accordance with the present embodiment, the floating gate electrode layer 3, composed of polysilicon, and the first electrode layer 30, formed simultaneously with the formation of the floating gate electrode layer 3, are thinned as shown in FIGS. 13(a) and 13(b). This enables a reduction in the height of steps in the stack gate structure.

Thus, the second electrode layer 50, formed simultaneously with the formation of the control gate electrode layer 5, composed of polysilicon, need not be thinned as much as the first electrode layer 30. Therefore, fabrication of a resistor using the second electrode layer 50, composed of polysilicon, provides a stable resistance without the need to add steps.

Further, in the nonvolatile semiconductor memory in accordance with the present embodiment, the second electrode layer 50, composed of polysilicon, has a higher resistivity than the low-resistance layer 9, 90, composed of metal silicide. This enables a reduction in the area of the resistor.

Moreover, the nonvolatile semiconductor memory in accordance with the present embodiment enables a reduction in the contact area between the second low-resistance layer 90 and the second electrode layer 50. This in turn enables a further increase in resistivity.

(Manufacturing Method)

A method of manufacturing a nonvolatile semiconductor memory in accordance with a third embodiment of the present invention is similar to that in accordance with the first embodiment. Accordingly, those components which are also used in the first embodiment will not be described.

FIGS. 11(a) to 13(a) are sectional views of a memory cell transistor region in a NAND flash memory in which the memory cell transistor region extends in a direction perpendicular to gate electrodes, that is, the column direction. FIGS. 11(b) to 13(b) are sectional views of the resistor region, located around the periphery of the memory transistor region.

First, as is the case with the first embodiment, shown in FIG. 1(a), the normal manufacturing method is used to form an isolation layer in the p well or semiconductor substrate 1. Then stack gate structures are formed on the memory cell transistor region of the p well or semiconductor substrate 1 and n+ source/drain diffusion layers 13 are formed in the memory cell transistor region of the p well or semiconductor substrate 1.

As shown in FIG. 1(b), simultaneously with the formation of the memory cell transistor region, stack structures are formed on the resistor region of the p well or semiconductor substrate 1.

Then, a first interlayer insulating film 7 is formed between the stack gate structures by deposition.

The resulting surface is then flattened by CMP.

Then, as shown in FIGS. 11(a) and 11(b), a photoresist layer 8 is formed. To form, during the subsequent step, a low-resistance layer composed of silicide with metal such as cobalt or nickel on the control gate electrode layer 5 and second electrode layer 50, the mask film on the control gate electrode layer 5 and second electrode layer 50 is etched away through the photoresist layer 8 as a mask.

As s result, in the memory cell transistor region, the nitride film on the control gate electrode layer 5 is etched with the control gate electrode layer 5 exposed, as shown in FIG. 11(a). In the resistor region, the nitride film is etched only in the area in which the low-resistance layer is formed, by the pattern width $W_2$ to expose the second electrode layer 50, as shown in FIG. 11(b).

The present embodiment uses, as a resistor, the second electrode layer 50, composed of polysilicon, has a higher resistivity than metal silicide. This allows a required resistance to be obtained with a reduced occupation area. In this case, the optimum resistance for the resistor can be accurately obtained by reducing the contact area of a stack structure portion including the second low-resistance layer 90, to which the contact plugs 10 are connected, and the second electrode layer 50.

Then, as shown in FIG. 12(a), in the memory cell transistor region, metal such as cobalt or nickel is deposited on the control gate electrode layer 5. A thermal treatment is then performed to silicidize the control gate electrode layer 5, composed of polysilicon, to form a first low-resistance layer 9. At the same time, as shown in FIG. 12(b), in the resistor region, metal such as cobalt or nickel is deposited on the second electrode layer 50. A thermal treatment is then performed to silicidize the second electrode layer 50, composed of polysilicon, to form a second low-resistance layer 90.

Then, as shown in FIGS. 13(a) and 13(b), in the memory cell transistor region, a second interlayer insulating film 11 is formed on the first interlayer insulating film 7 and the first low-resistance layer 9 by deposition. At the same time, in the resistor region, a second interlayer insulating film 11 is formed on the first interlayer insulating film 7, the nitride film 6, and the second low-resistance layer 90 by deposition.

Then, the resulting surface is flattened by CMP or the like, and contact plugs 10 to be connected to the low-resistance layer 90 are then formed in the second interlayer insulating film 11 by photolithography or the like. The subsequent steps are the same as normal steps of forming a interconnect layer and will thus not be described.

(Example of Planar Pattern of the Resistor)

An example of the planar pattern of the resistor region of the nonvolatile semiconductor memory in accordance with the third embodiment is as shown in FIGS. 9 and 10 as is the case with the first and second embodiments.

The resistor comprises the second electrode layer 50, composed of polysilicon, the second low-resistance layer 90, formed on the second electrode layer 50, the contact plugs 10, connected to the low resistance layer 90, and the interconnect layer 14, located on the contact plugs 10. In the resistor region of the nonvolatile semiconductor memory in accordance with the third embodiment of the present invention, a plurality of resistors may be arranged on the basis of the planar pattern configuration shown in FIGS. 9 and 10.

According to the nonvolatile semiconductor memory and the method of manufacturing the nonvolatile semiconductor memory in accordance with the third embodiment of the present invention, the second electrode layer 50, formed simultaneously with the formation of the control gate electrode layer 5, is used to make a resistor. This provides a stable resistance without the need to add steps. Further, the resistor is formed only of the second electrode layer 50, formed simultaneously with the formation of the control gate electrode layer 5, composed of polysilicon. This allows the resistor to be made of the material with a high resistivity, enabling a reduction in the occupation area of the resistor. Moreover, the nonvolatile semiconductor memory in accordance with the present embodiment enables a reduction in the contact area between the second low-resistance layer 90 and the second electrode layer 50. This in turn enables a further increase in resistivity.

[Fourth Embodiment]

Also in a nonvolatile semiconductor memory in accordance with a fourth embodiment of the present invention, the memory cell transistor region is based on the structure of a NAND flash memory.

Figure 16:
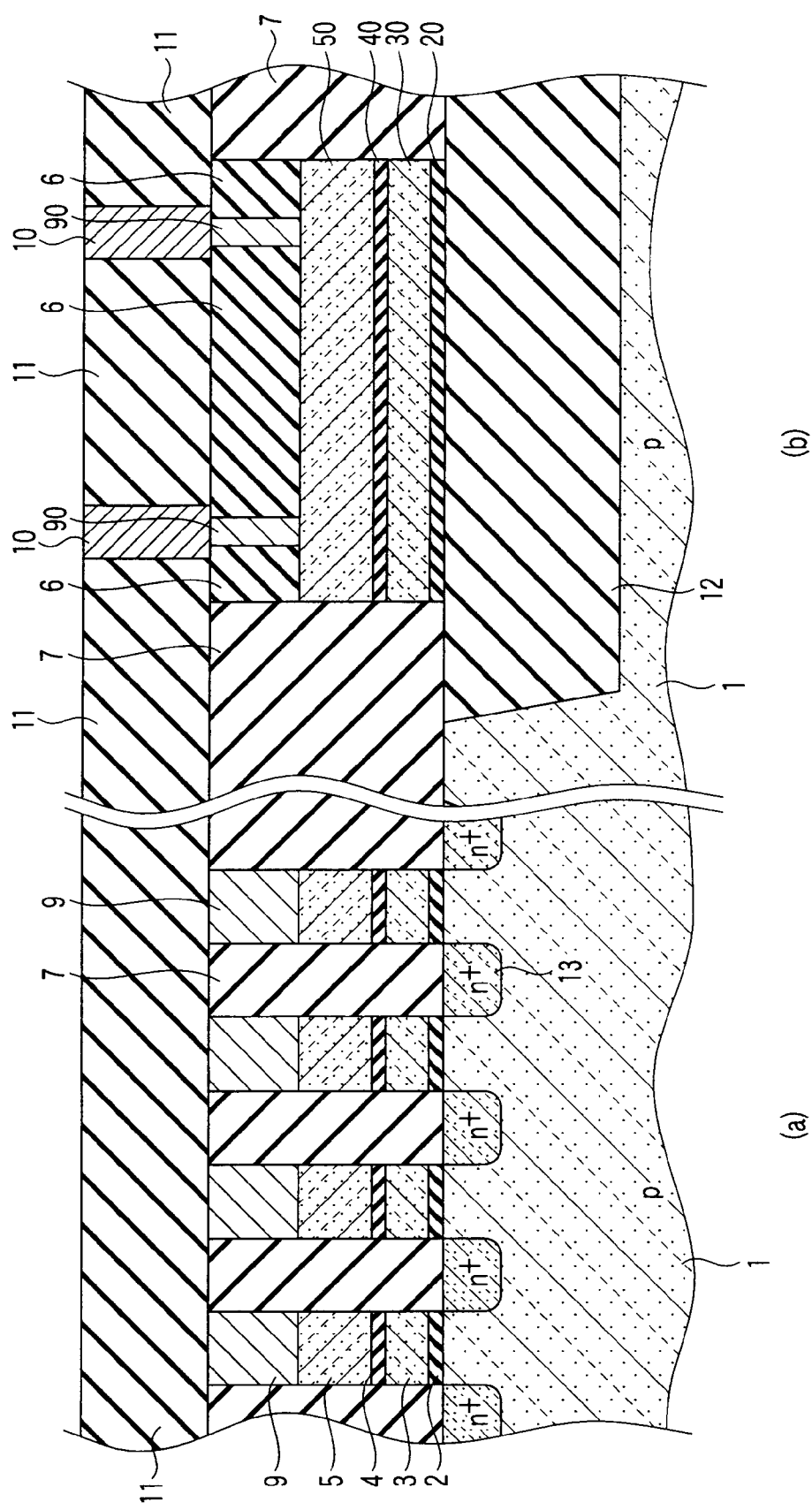
FIG. 16 is a sectional view showing a step of the manufacturing method in accordance with the fourth embodiment.

FIG. 16 is a sectional view of the nonvolatile semiconductor memory in accordance with the present embodiment.

As shown in FIG. 16(a), the nonvolatile semiconductor memory in accordance with the present embodiment comprises a memory cell transistor region separated into elements in the p well or semiconductor substrate 1 in the row direction, the elements being arranged in series in the column direction and a resistor region located on the isolation region 12, located in the p well or semiconductor substrate 1 as shown in FIG. 16(b).

The memory cell transistor region is similar to that in the first and second embodiment, shown in FIGS. 4(a) and 8(a), and its components will thus not be described in detail.

The resistor region also has a configuration similar to that in the second embodiment of the present invention, shown in FIG. 8(b), and its components will thus not be described in detail. The fourth embodiment is different from the second embodiment in that the pattern width W2 with which the second low-resistance layer 90 is formed is smaller than the pattern width W1 with which the second low-resistance layer

Figure 6:
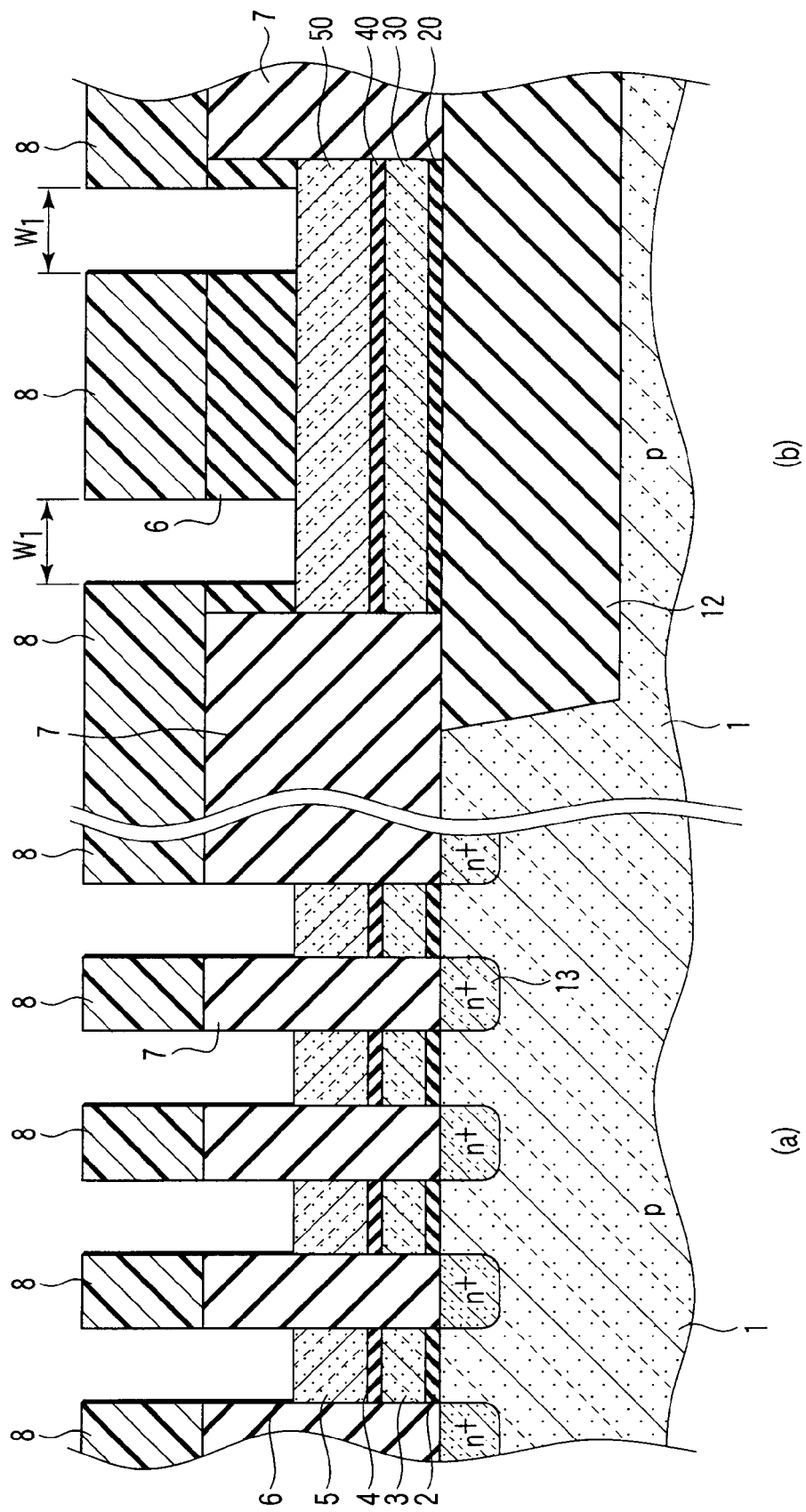
FIG. 6 is a sectional view showing a step of the manufacturing method in accordance with the second embodiment.
Figure 7:
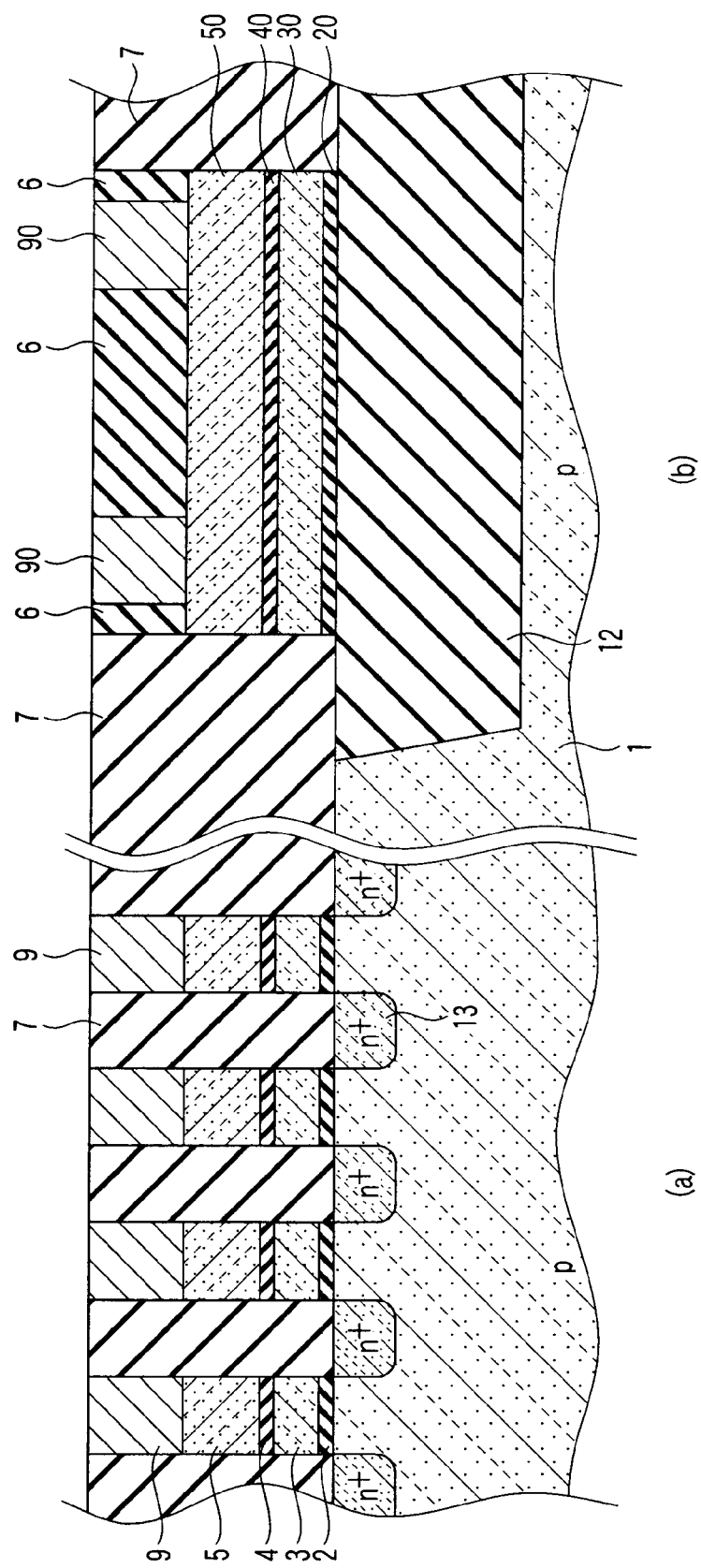
FIG. 7 is a sectional view showing a step of a manufacturing method in accordance with the second embodiment.
Figure 14:
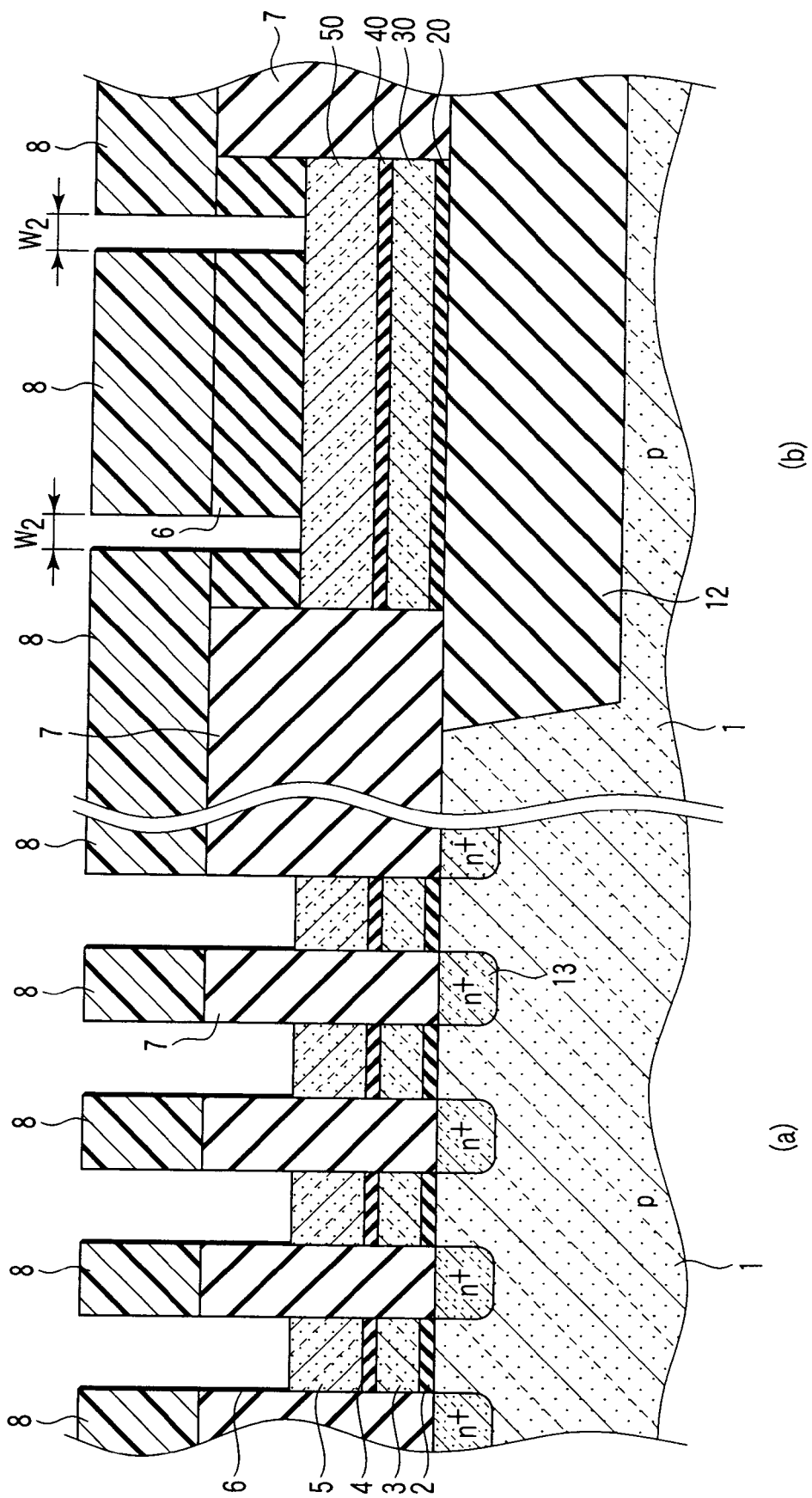
FIG. 14 is a sectional view showing a step of the manufacturing method in accordance with a fourth embodiment.
Figure 15:
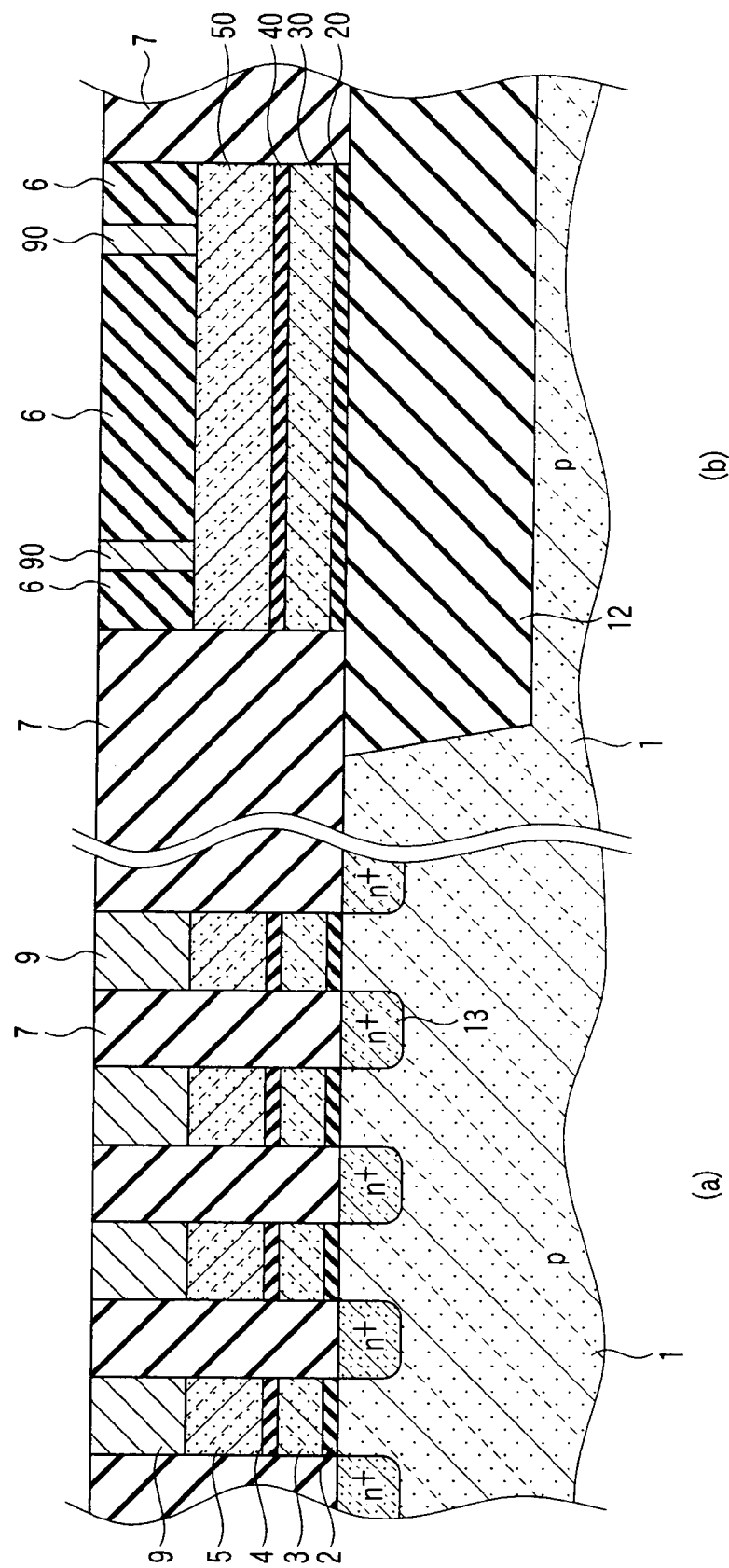
FIG. 15 is a sectional view showing a step of a manufacturing method in accordance with the fourth embodiment.

90 is formed in accordance with the second embodiment, shown in FIG. 6, that is, $W_2 < W_1$, as shown in FIG. 14(*b*). This setting enables a reduction in the contact area between the second low-resistance layer 90 and the second electrode layer 50 as shown in FIG. 15(*b*). This in turn enables a further increase in resistance.

In the nonvolatile semiconductor memory in accordance with the present embodiment, the second electrode layer 50 of a stack structure is used as a resistor in the resistor region as shown in FIG. 16(*b*).

In the nonvolatile semiconductor memory in accordance with the present embodiment, the first electrode layer 30, formed simultaneously with the formation of the floating gate electrode layer 3, is thinned as shown in FIGS. 16(*a*) and 16(*b*). This enables a reduction in the height of steps in the stack gate structure. Thus, the second electrode layer 50, formed simultaneously with the formation of the control gate electrode layer 5, need not be thinned as much as the first electrode layer 30. Therefore, fabrication of a resistor using the second electrode layer 50 provides a stable resistance without the need to add steps.

Further, in the nonvolatile semiconductor memory in accordance with the present embodiment, the second electrode layer 50, composed of polysilicon, has a higher resistivity than the low-resistance layer 9, 90, composed of metal silicide. This enables a reduction in the area of the resistor.

Moreover, in the nonvolatile semiconductor memory in accordance with the present embodiment, the resistor is formed on the isolation layer 12, formed in the p well or semiconductor substrate 1 as shown in FIG. 16(*b*). This enables a reduction in the parasitic capacitor of the resistor region to improve the high frequency characteristic of the resistor. Furthermore, the nonvolatile semiconductor memory in accordance with the present embodiment enables a reduction in the contact area between the low-resistance layer 9 and the second electrode layer 50. This in turn enables a further increase in resistance.

(Manufacturing Method)

A method of manufacturing a nonvolatile semiconductor memory in accordance with a fourth embodiment of the present invention is similar to that in accordance with the second embodiment. Accordingly, those components which are also used in the first embodiment will not be described.

FIGS. 14(*a*) to 16(*a*) are sectional views of a memory cell transistor region in a NAND flash memory in which the memory cell transistor region extends in a direction perpendicular to gate electrodes, that is, the column direction. FIGS. 14(*b*) to 16(*b*) are sectional views of the resistor region, located around the periphery of the memory transistor region.

Figure 5:
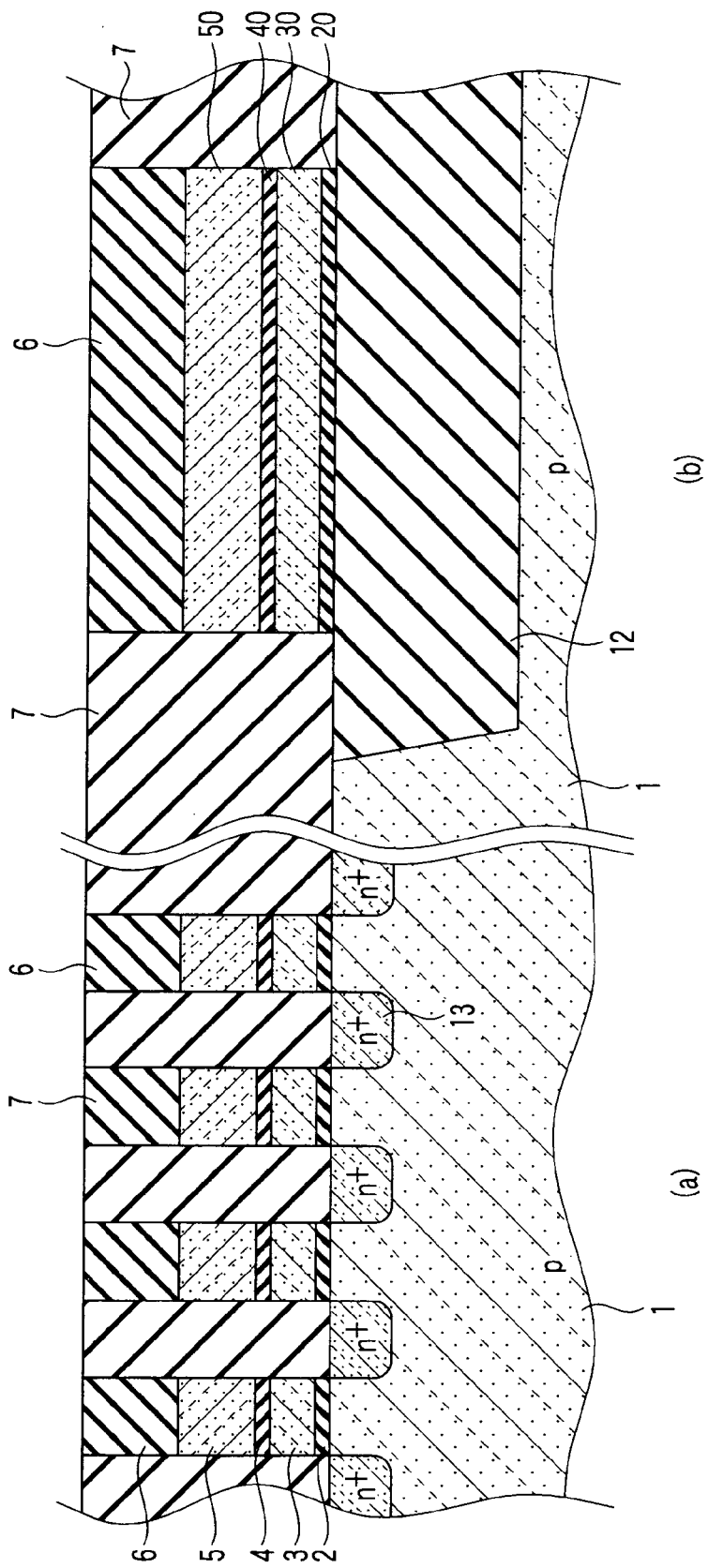
FIG. 5 is a sectional view showing a step of a manufacturing method in accordance with a second embodiment.

First, as is the case with the second embodiment, shown in FIGS. 5(*a*), the normal manufacturing method is used to form an isolation layer in the p well or semiconductor substrate 1. Then stack gate structures are formed on the memory cell transistor region of the p well or semiconductor substrate 1 and n$^+$ source/drain diffusion layers 13 are formed in the memory cell transistor region in the p well or semiconductor substrate 1. As shown in FIG. 5(*b*), in the resistor region simultaneously with the formation of the memory cell transistor region, stack structures are formed on an isolation layer 12. Then, a first interlayer insulating film 7 is formed between the stack gate structures by deposition. The resulting surface is then flattened by CMP.

Then, as shown in FIGS. 14(*a*) and 14(*b*), a photoresist layer 8 is formed. To form, during the subsequent step, a low-resistance layer composed of silicide with metal such as cobalt or nickel on the control gate electrode layer 5 and second electrode layer 50, the mask film 6 on the control gate electrode layer 5 and second electrode layer 50 is etched away through the photoresist layer 8 as a mask.

As s result, in the memory cell transistor region, the nitride film on the control gate electrode layer 5 is etched with the control gate electrode layer 5 exposed, as shown in FIG. 14(*a*). In the resistor region, the nitride film is etched only in the area in which the low-resistance layer is formed, by the pattern width $W_2$ to expose the second electrode layer 50.

The present embodiment uses, as a resistor, the second electrode layer 50, which has a higher resistivity than metal silicide. This allows a required resistance to be obtained with a reduced occupation area. In this case, the optimum resistance for the resistor can be accurately obtained by reducing the area of a stack structure portion including the low-resistance layer 90, to which the contact plugs 10 are connected, and the second electrode layer 50.

Then, as shown in FIG. 15(*a*), in the memory cell transistor region, metal such as cobalt or nickel is deposited on the control gate electrode layer 5. A thermal treatment is then performed to silicidize the control gate electrode layer 5, composed of polysilicon, to form a first low-resistance layer 9. At the same time, as shown in FIG. 15(*b*), in the resistor region, metal such as cobalt or nickel is deposited on the second electrode layer 50. A thermal treatment is then performed to silicidize the second electrode layer 50, composed of polysilicon, to form a low-resistance layer 90.

Then, as shown in FIG. 16(*a*), in the memory cell transistor region, a second interlayer insulating film 11 is formed on the first interlayer insulating film 7 and the first low-resistance layer 9 by deposition. At the same time, in the resistor region, a second interlayer insulating film 11 is formed on the first interlayer insulating film 7, the nitride film 6, and the second low-resistance layer 90 by deposition as shown in FIG. 16(*b*).

Then, the resulting surface is flattened by CMP or the like, and contact plugs 10 to be connected to the second low-resistance layer 90 are then formed in the second interlayer insulating film 11 by photolithography or the like. The subsequent steps are the same as normal steps of forming a interconnect layer and will thus not be described.

(Example of Planar Pattern of the Resistor)

An example of the planar pattern of the resistor region of the nonvolatile semiconductor memory in accordance with the fourth embodiment is as shown in FIGS. 9 and 10 as is the case with the first and second embodiments.

The resistor comprises the second electrode layer 50, composed of polysilicon, the second low-resistance layer 90, formed on the second electrode layer 50, the contact plugs 10, connected to the second low-resistance layer 90, and the interconnect layer 14, located on the contact plugs 10. In the resistor region of the nonvolatile semiconductor memory in accordance with the fourth embodiment of the present invention, a plurality of resistors may be arranged on the basis of the planar pattern configuration shown in FIGS. 9 and 10.

According to the nonvolatile semiconductor memory and the method of manufacturing the nonvolatile semiconductor memory in accordance with the fourth embodiment of the present invention, the second electrode layer 50, formed simultaneously with the formation of the control gate electrode layer 5, composed of polysilicon, is used to make a resistor. This provides a stable resistance without the need to add steps.

Further, the resistor is formed only of the second electrode layer 50, composed of polysilicon. This allows the resistor to be made of the material with a high resistivity, enabling a reduction in the occupation area of the resistor.

Moreover, in the nonvolatile semiconductor memory in accordance with the fourth embodiment of the present invention, the resistor region is formed on the isolation region 12, formed in the p well or semiconductor substrate 1. This enables a reduction in the parasitic capacitor of the resistor region, improving the high frequency characteristic of the resistor. Furthermore, the nonvolatile semiconductor memory in accordance with the present embodiment enables a reduction in the contact area between the second low-resistance layer 90 and the second electrode layer 50. This in turn enables a further increase in resistance.

(NAND Circuit Configuration)

The schematic circuit configuration of a memory cell array 130 in the nonvolatile semiconductor memory in accordance with the first to fourth embodiments of the present invention comprises that of a NAND memory cell array.

As shown in FIG. 17 in detail, a NAND cell unit 132 comprises memory cell transistors M0 to M15 and select gate transistors SG1 and SG2. A drain of the select gate transistor SG 1 is connected to bit lines ... $BL_{j-1}, BL_j, BL_{j+1}$ ... via bit line contacts CB. A source of the select gate transistor SG2 is connected to a common source line SL via a source line contact CS.

A plurality of memory cell transistors M0 to M15 are connected together in series via their source and drain regions in a direction in which the bit lines $BL_{j-1}, BL_j, BL_{j+1}$ extend. The select gate transistors SG1 and SG2 are arranged at the respective ends of the group of the memory cell transistors M0 to M15. The memory cell transistors are further connected to the bit line contacts CB and source line contacts CS via the select gate transistors SG1 and SG2. One NAND cell unit 132 is thus constructed. A plurality of such NAND cell units 132 are arranged in a direction in which word lines WL0, WL1, WL2, WL3, ..., WL14, and WL15 orthogonal to the bit lines ... $BL_{j-1}, BL_j, BL_{j+1}$ ... extend.

[Fifth Embodiment]
(AND Circuit Configuration)

Figure 18:
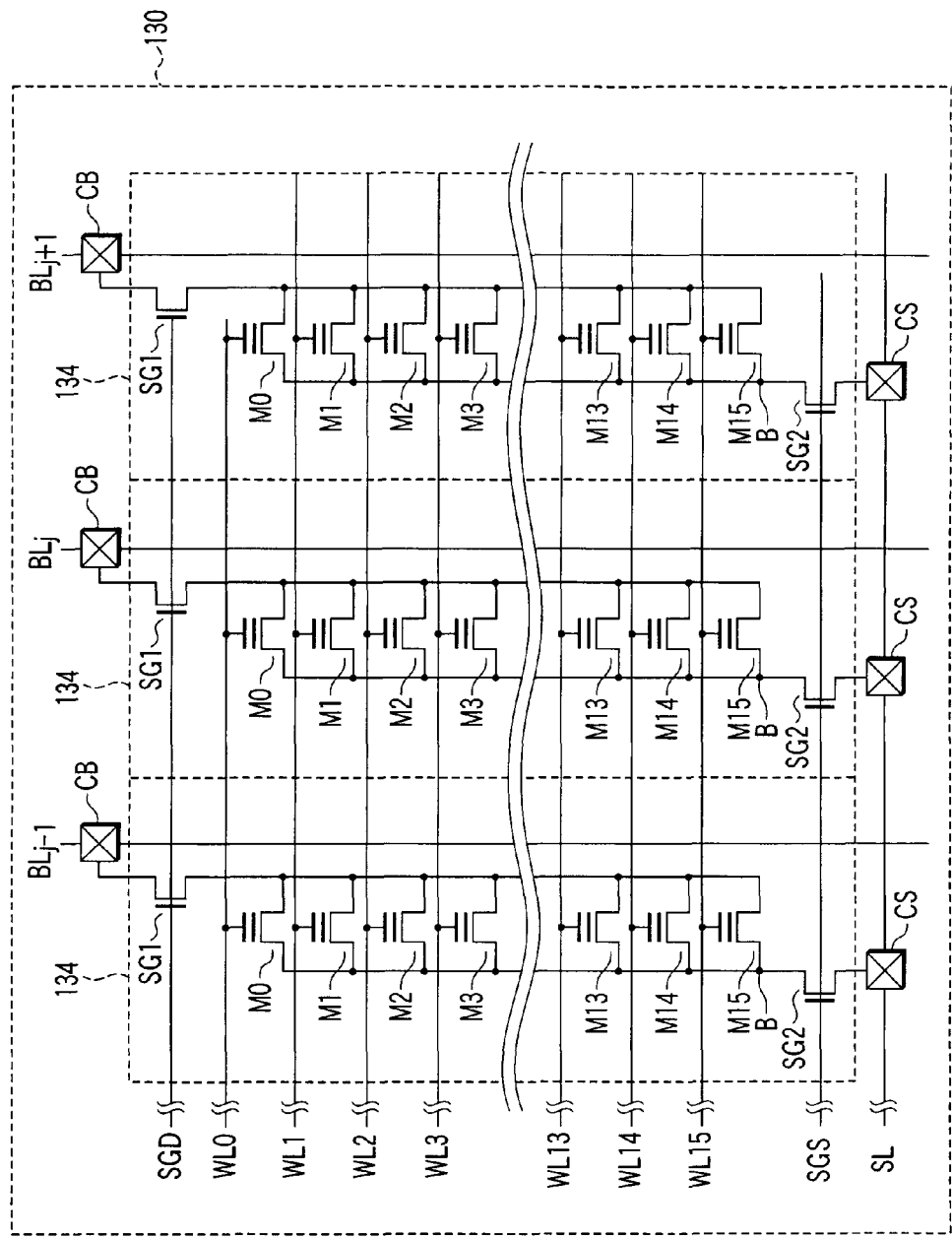
FIG. 18 is a circuit diagram of an AND memory cell array.

The schematic circuit configuration of the memory cell array 130 in the nonvolatile semiconductor memory in accordance with a fifth embodiments of the present invention comprises that of an AND memory cell array as shown in FIG. 18.

In FIG. 18, an AND cell unit 134 is enclosed by a dotted line. As shown in FIG. 18 in detail, the AND cell unit 134 comprises the memory cell transistors M0 to M15 connected together in parallel and the select gate transistors SG1 and SG2. The drain of the select gate transistor SG 1 is connected to the bit lines ... $BL_{j-1}, BL_j, BL_{j+1}$ ... via the bit line contacts CB. The source of the select gate transistor SG2 is connected to the common source line SL via the source line contact CS.

In the AND cell unit 134, the drain regions of the memory cell transistors M0 to M15 are connected together, and the source regions of the memory cell transistors M0 to M15 are also connected together. That is, as shown in FIG. 18, in the AND cell unit 134 of the AND flash memory, the memory cell transistors M0 to M15 are connected together in parallel. The bit line-side select transistor SG1 is connected to one side of the group of the memory cell transistors M0 to M15. The bit line-side select transistor SG2 is connected to the other side of the group of the memory cell transistors M0 to M15. The word lines WL0 to WL15 are connected to the gates of the memory cell transistors M0 to M15, respectively, on a one-to-one correspondence. A select gate line SGD is connected to a gate of the bit line-side select transistor SG1. A select gate line SGS is connected to a gate of the bit line-side select transistor SG2.

Also in the nonvolatile semiconductor memory of the AND configuration in accordance with the present embodiment, the memory cell transistor region is based on a stack gate structure similar to that of the memory cell transistors in accordance with the first to fourth embodiments. The resistor region, located around the periphery of the memory cell transistor region, also comprises a stack structure similar to those of the resistor region in accordance with the first to fourth embodiments. Therefore, the nonvolatile semiconductor memory of the AND configuration and the method of manufacturing the nonvolatile semiconductor memory of the AND configuration in accordance with the present embodiment may adopt structures of the memory cell transistor region and resistor region and a method of manufacturing these structures which are similar to those in accordance with the first to fourth embodiments.

According to the nonvolatile semiconductor memory in accordance with the fifth embodiment of the present invention, the second electrode layer, composed of polysilicon, is used to make a resistor. This provides a stable resistance without the need to add steps. Further, the resistor is formed only of the second electrode layer. This enables an increase in resistivity and a reduction in the occupation area of the resistor. Moreover, the nonvolatile semiconductor memory in accordance with the present embodiment enables a reduction in the contact area between the low-resistance layer and the second electrode layer. This allows the formation of a resistor with a further increased resistance.

[Sixth Embodiment]
(NOR Circuit Configuration)

Figure 19:
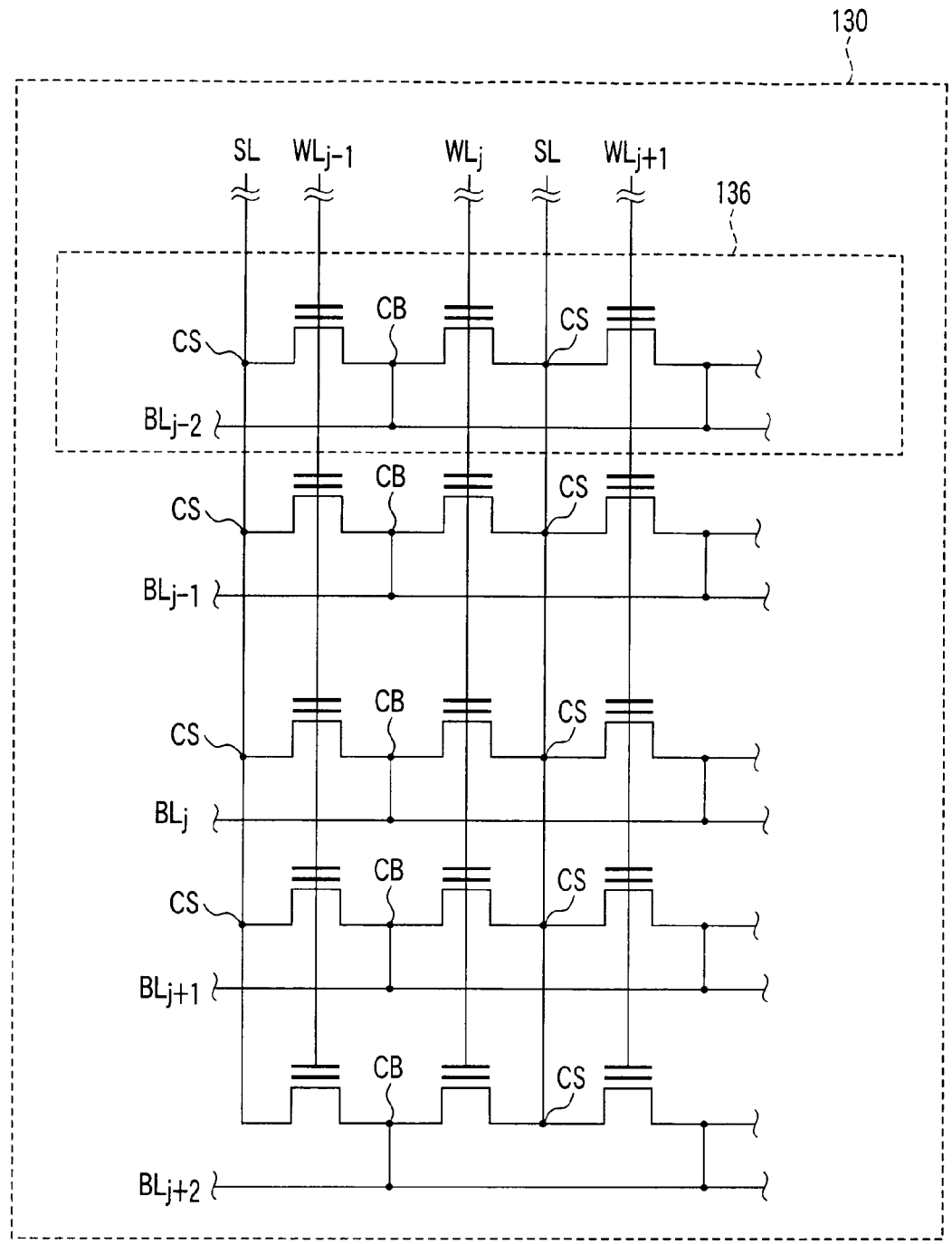
FIG. 19 is a circuit diagram of a NOR memory cell array.

The schematic circuit configuration of the memory cell array 130 in the nonvolatile semiconductor memory in accordance with a sixth embodiments of the present invention comprises that of a NOR memory cell array as shown in FIG. 19.

In FIG. 19, a NOR cell unit 136 is enclosed by a dotted line. In the NOR cell unit 136, a common source region of two adjacent memory cell transistors is connected to the source line SL via the source line contact CS. A common drain region of two adjacent memory cell transistors is connected to a bit line ... $BL_{j-2}, BL_{j-1}, BL_j, BL_{j+1}, BL_{j+2}$ ... via the bit line contact CB. NOR cell units 136 are arranged in the direction of word lines $WL_{i-1}, W_{Li}, W_{Li+1}, ...$ orthogonal to the bit line ... $BL_{j-2}, BL_{j-1}, BL_j, BL_{j+1}, BL_{j+2}$ .... The gate of each of the memory cell transistors in each NOR cell unit 136 is connected to a corresponding one of the word lines WLi−1, WLi, WLi+1 .... The nonvolatile semiconductor memory of the NOR type is characterized by being able to perform a high-speed reading operation compared to NAND nonvolatile semiconductor memories.

Also in the nonvolatile semiconductor memory of the NOR configuration in accordance with the present embodiment, the memory cell transistor region is based on a stack gate structure similar to those of the memory cell transistors in accordance with the first to fourth embodiments. The resistor region, located around the periphery of the memory cell transistor region, also comprises a stack structure similar to that of the resistor region in accordance with the first to fourth embodiments. Therefore, the nonvolatile semiconductor memory of the NOR configuration and the method of manufacturing the nonvolatile semiconductor memory of the NOR configuration in accordance with the present embodiment may adopt structures of the memory cell transistor region and resistor region and a method of manufacturing these structures which are similar to those in accordance with the first to fourth embodiments.

According to the nonvolatile semiconductor memory in accordance with the sixth embodiment of the present invention, the second electrode layer is used to make a resistor. This provides a stable resistance without the need to add steps. Further, the second electrode layer, composed of polysilicon is used as a resistor. This allows the resistor to be made of the material with a high resistivity, enabling a reduction in the occupation area of the resistor. Moreover, the nonvolatile semiconductor memory in accordance with the present embodiment enables a reduction in the contact area between the low-resistance layer and the second electrode layer. This allows the formation of a resistor with a further increased resistance.

[Seventh Embodiment]
(Two-Transistor/Cell Circuit Configuration)

Figure 20:
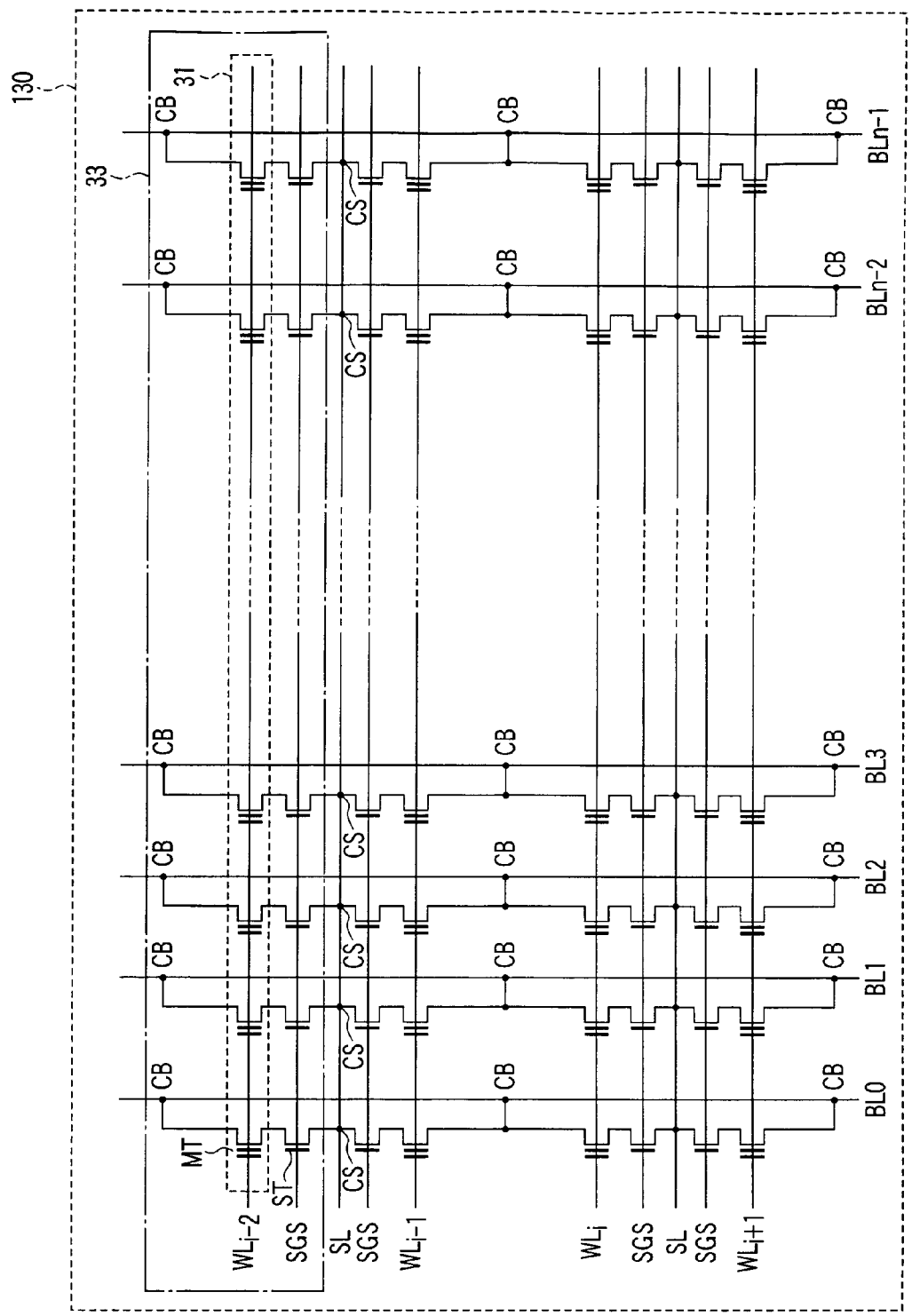
FIG. 20 is a circuit diagram of a two-transistor/cell memory cell array.

The schematic circuit configuration of the memory cell array 130 in the nonvolatile semiconductor memory in accordance with a seventh embodiments of the present invention comprises that of a two-transistor/cell memory cell array as shown in FIG. 20.

An example of the nonvolatile semiconductor memory in accordance with the present embodiment is based on a structure based on a two-transistor/cell scheme. The drain region of the source/drain region of each memory cell transistor MT is connected to the corresponding bit line contact CB. The source region of the source/drain region of the memory cell transistor MT is connected to the drain region of the corresponding select transistor ST. The source region of the select transistor ST is connected to the corresponding source line contact CS. Such memory cells based on the two-transistor/cell scheme are arranged in parallel in the word line direction to provide a memory cell block 33 as shown in FIG. 20. In each memory cell block 33, the word line $WL_{i-2}$ is connected to the control gate electrode layers of all the memory cell transistors to provide a page unit 31. Of course, the pages in a plurality blocks may be defined as a page unit. Moreover, the select gate line SGS is connected to the gate electrodes of all the select transistors in the memory cell block 33. On the other hand, in the direction in which bit lines BL0, BL1, BL2, ..., BLn-1 extend, circuit structures each obtained by folding back the memory cell based on the two-transistor/cell scheme relative to the source line SL are arranged in series.

Also in the nonvolatile semiconductor memory of the two-transistor/cell configuration in accordance with the present embodiment, the memory cell transistor region is based on a stack gate structure similar to those of the memory cell transistors in accordance with the first to fourth embodiments. The resistor region, located around the periphery of the memory cell transistor region, also comprises a stack structure similar to that of the resistor region in accordance with the first to fourth embodiments. Therefore, the nonvolatile semiconductor memory of the two-transistor/cell configuration and the method of manufacturing the nonvolatile semiconductor memory of the two-transistor/cell configuration in accordance with the present embodiment may adopt structures of the memory cell transistor region and resistor region and a method of manufacturing these structures which are similar to those in accordance with the first to fourth embodiments.

According to the nonvolatile semiconductor memory in accordance with the seventh embodiment of the present invention, the second electrode layer is used to make a resistor. This provides a stable resistance without the need to add steps. Further, the second electrode layer, composed of polysilicon, is used as a resistor. This allows the resistor to be made of the material with high resistivity, enabling a reduction in the occupation area of the resistor. Moreover, the nonvolatile semiconductor memory in accordance with the present embodiment enables a reduction in the contact area between the low-resistance layer and the second electrode layer. This allows the formation of a resistor with a further increased resistance.

[Eighth Embodiment]
(Three-Transistor/Cell Circuit Configuration)

Figure 21:
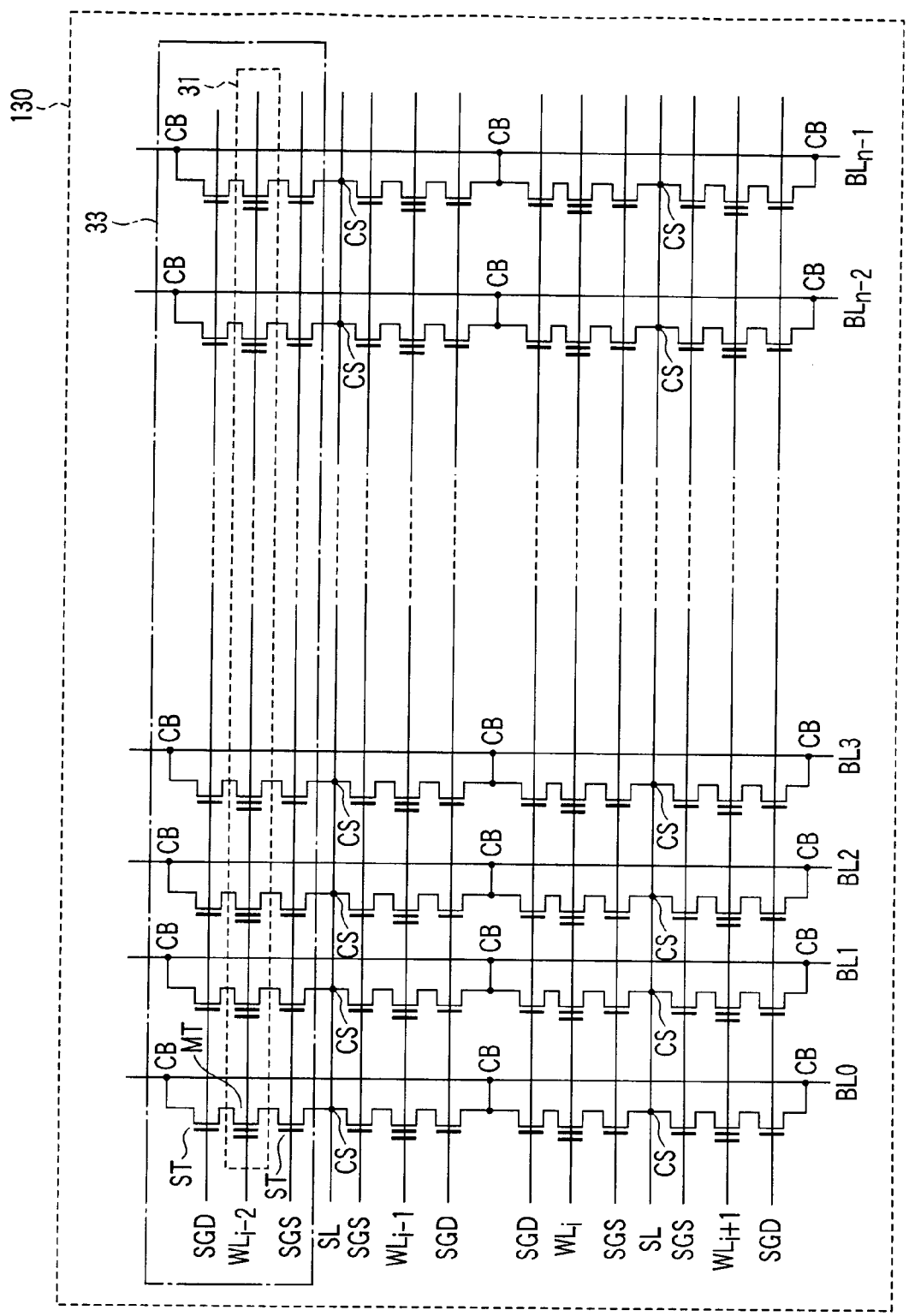
FIG. 21 is a circuit diagram of a three-transistor/cell memory cell array.

The schematic circuit configuration of the memory cell array 130 in the nonvolatile semiconductor memory in accordance with an eighth embodiments of the present invention comprises that of a three-transistor/cell memory cell array as shown in FIG. 21.

An example of the nonvolatile semiconductor memory in accordance with the present embodiment is based on a structure based on a three-transistor/cell scheme. The select transistors ST1 and ST2 are arranged on the respective sides of each memory cell transistor MT. The drain region of the memory cell transistor MT is connected to the corresponding bit line contact CB via the bit line-side select transistor ST1. The source region of the memory cell transistor MT is connected to the corresponding source contact CS via the source line-side select transistor ST2. Such memory cells based on the three-transistor/cell scheme are arranged in parallel in the word line direction to provide a memory cell block 33 as shown in FIG. 21. In each memory cell block 33, the word line $WL_{i-2}$ is connected to the control gate electrode layers of all the memory cell transistors to provide a page unit 31. Of course, the pages in a plurality blocks may be defined as a page unit. Moreover, the select gate line SGS is connected to the gate electrodes of all the source line-side select transistors ST2. The select gate line SGD is connected to the gate electrodes of all the bit line-side select transistors ST1. On the other hand, in the direction in which the bit lines BL0, BL1, BL2, ..., BLn-1 extend, circuit structures each obtained by folding back the memory cell based on the three-transistor/cell scheme relative to the source line SL are arranged in series.

The nonvolatile semiconductor memory in accordance with the present embodiment enables operations that are intermediate between those of the NAND type and those of the NOR type.

Also in the nonvolatile semiconductor memory of the three-transistor/cell configuration in accordance with the present embodiment, the memory cell transistor region is based on a stack gate structure similar to those of the memory cell transistors in accordance with the first to fourth embodiments. The resistor region, located around the periphery of the memory cell transistor region, also comprises a stack structure similar to that of the resistor region in accordance with the first to fourth embodiments. Therefore, the nonvolatile semiconductor memory of the three-transistor/cell configuration and the method of manufacturing the nonvolatile semiconductor memory of the three-transistor/cell configuration in accordance with the eighth embodiment may adopt structures of the memory cell transistor region and resistor region and a method of manufacturing these structures which are similar to those in accordance with the first to fourth embodiments.

According to the nonvolatile semiconductor memory in accordance with the eighth embodiment of the present invention, the second electrode layer, composed of polysilicon, is used to make a resistor. This provides a stable resistance without the need to add steps. Further, the second electrode layer, composed of polysilicon, is used as a resistor. This allows the resistor to be made of the material with high resistivity, enabling a reduction in the occupation area of the resistor. Moreover, the nonvolatile semiconductor memory in accordance with the present embodiment enables a reduction in the contact area between the low-resistance layer and the second electrode layer. This allows the formation of a resistor with a further increased resistance.

[Applications]

The operation mode of the nonvolatile semiconductor memories in accordance with the embodiments of the present invention is roughly divided into three types called a page mode, a byte mode, and an EEPROM mode having a ROM region, respectively.

The page mode is an operation of reading out the memory cell column present on each word line in the flash memory cell array, into a sense amplifier at a time via the bit lines or writing data from the sense amplifier into the memory cell column at a time. That is, reading and writing operations are performed in terms of pages.

In contrast, the byte mode reads out the memory cells present on each word line in the flash memory cell, into the sense amplifier in terms of bytes or writing data from the sense amplifier into the memory cells in terms of bytes. That is, the byte mode is different from the page mode in that reading and writing operations are performed in terms of bytes.

On the other hand, the EEPROM mode having a ROM region is an operation for dividing the interior of the flash memory cell array into a flash memory section and a EEPROM section having a ROM region and switchably operates the EEPROM section having a ROM region to read information from the flash memory cell array in terms of pages or bytes for rewriting.

Of course, the nonvolatile semiconductor memories in accordance with the above embodiments can each be operated in the page mode, the byte mode, and the EEPROM mode having a ROM region.

Various applications are possible for the nonvolatile semiconductor memories in accordance with the first to eighth embodiments of the present invention. Some of these applications are shown in FIGS. 22 to 36.

(Application 1)

Figure 22:
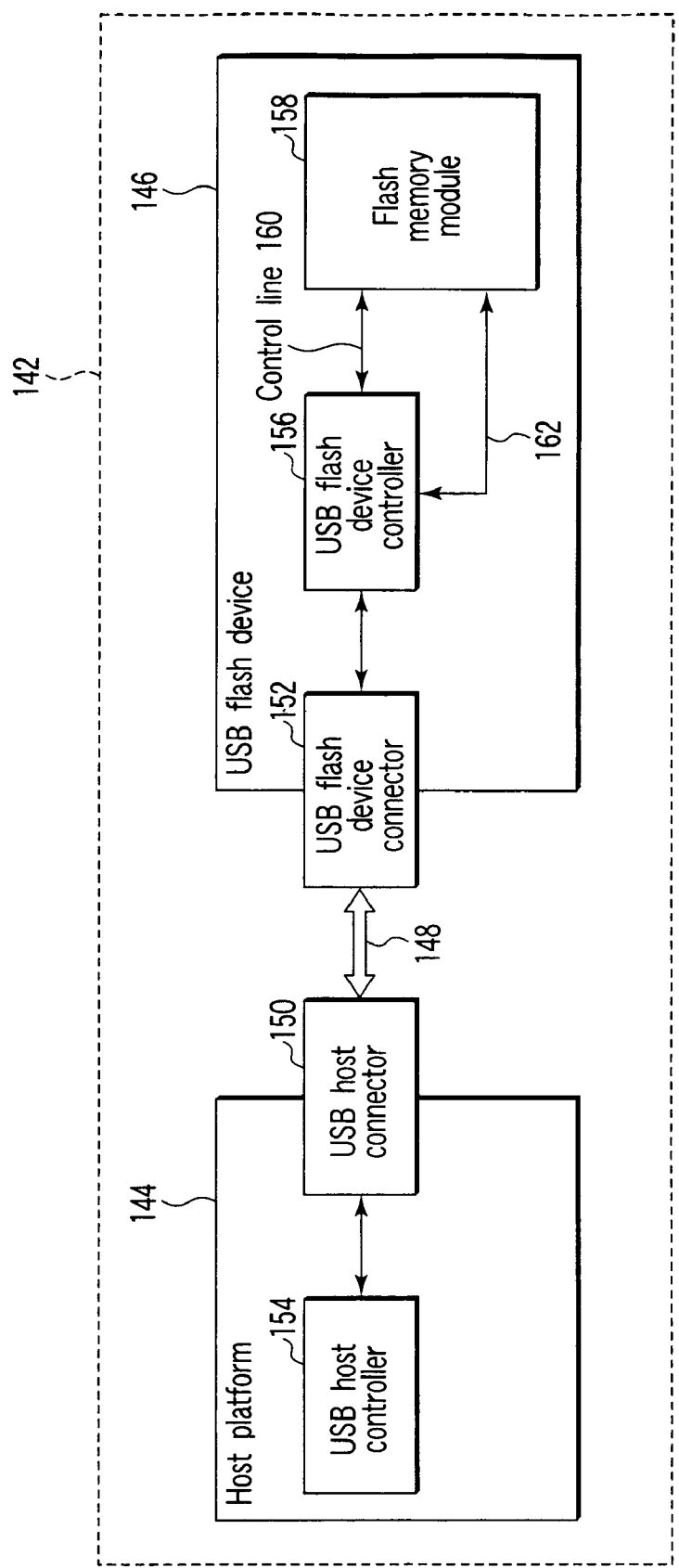
FIG. 22 is a block diagram showing an application of the nonvolatile semiconductor memory.

FIG. 22 is a schematic block diagram of main components of a flash memory device and system. As shown in FIG. 22, the flash memory system 142 comprises a host platform 144 and a universal serial bus (USB) flash device 146.

The host platform 144 is connected to the USB flash device 146 via a USB cable 148. The host platform 144 is connected to the USB cable 148 via a USB host connector 150. The USB flash device 146 is connected to the USB cable 148 via a USB flash device connector 152. The host platform 144 has a USB host controller 154 that controls packet transmissions on a USB bus.

The USB flash device 146 includes a USB flash device controller 156 that controls the other components of the USB flash device 146 as well as the interfacing of the USB flash device 146 with the USB bus, the USB flash device connector 152, and at least one flash memory module 158 comprising the nonvolatile semiconductor memory in accordance with any of the first to eighth embodiments.

Connecting the USB flash device 146 to the host platform 144 starts a standard USB enumeration process. In this process, the host platform 144 recognizes the USB flash device 146 and selects a mode for communication with the USB flash device 146. The host platform 144 then transmits and receives data to and from the USB flash device 146 via a FIFO buffer called an end point and which stores transfer data. The host platform 144 recognizes a change in the physical or electrical condition of the USB flash device 146 such as installation or removal. The host platform 144 receives packets to be received, if any.

The host platform 144 sends a request packet to the USB host controller 154 to request a service from the USB flash device 146. The USB host controller 154 transmits a packet onto the USB cable 148. If the USB flash device 146 has an end point that has received the request packet, the USB flash device controller 156 accepts the request.

Then, the USB flash device controller 156 performs various operations such as data reading, writing, and erasing on the flash memory module 158. The USB flash device controller 156 also supports basic USB functions such as the acquisition of a USB address. The USB flash device controller 156 controls the flash memory module 158 via a control line 160 through which outputs from the flash memory module 158 are controlled or via various other signals such as a chip enable signal or read and write signals. The flash memory module 158 is connected to the USB flash device controller 156 also via an address data bus 162. The address data bus 162 transfers commands instructing a reading, writing or erasing operation to be performed on the flash memory module 158 as well as addresses and data for the flash memory module 158.

To inform the host platform 144 of the results and statuses of various operations requested by the host platform 144, the USB flash device 146 transmits status packets using a status end point (end point 0). In this process, the host platform 144 checks whether or not any status packet is present (poling). If no packet for a new status message is present, the USB flash device 146 returns an empty packet or a status packet itself.

As described above, the USB flash device 146 can provide various functions. The connectors may be directly connected together with the USB cable 148 omitted.

(Memory Card)
(Application 2)

Figure 23:
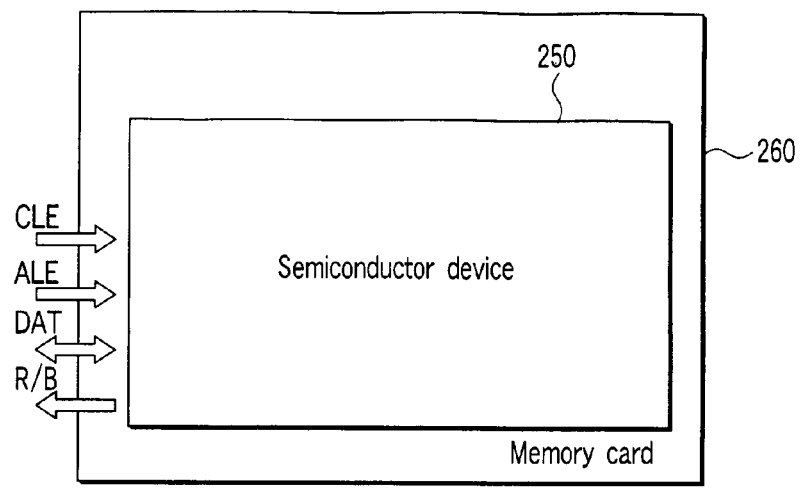
FIG. 23 is a block diagram of a memory card showing an application of the nonvolatile semiconductor memory.

By way of example, a memory card 260 including a semiconductor memory device 250 is configured as shown in FIG. 23. The nonvolatile semiconductor memory in accordance with any of the first to eighth embodiments is applicable to the semiconductor memory device 250. As shown in FIG. 23, the memory card 260 is operative to receive predetermined signals from an external device (not shown) or to output predetermined signals to the external device.

The memory card 260, containing the semiconductor memory device 250, connects to a signal line DAT, a command line enable signal line CLE, an address line enable signal line ALE, and a ready/busy signal line R/B. The signal line DAT transfers data signals, address signals, or command signals. The command enable signal line CLE transmits a signal indicating that a command signal is being transferred on the signal line DAT. The address enable signal line ALE transmits a signal indicating that an address signal is being transferred on the signal line DAT. The ready/busy signal line R/B transmits a signal indicating whether or not the semiconductor memory device 250 is ready.

(Application 3)

Figure 24:
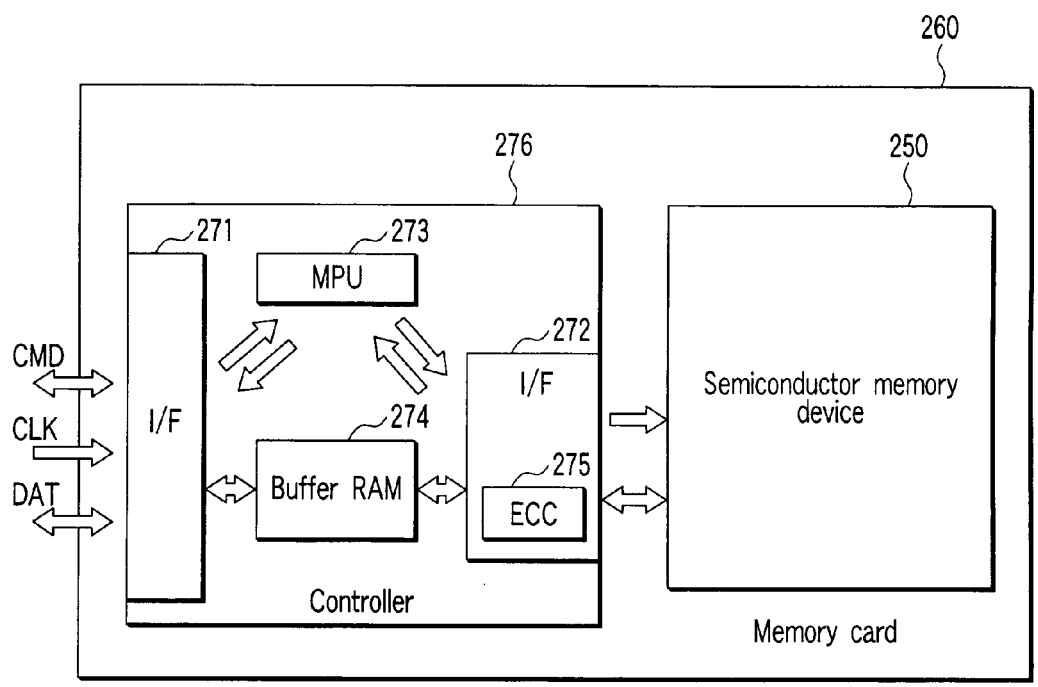
FIG. 24 is a block diagram of a memory card showing an application of the nonvolatile semiconductor memory.

Unlike the example of a memory card in FIG. 23, another specific example of the memory card 260 comprises not only the semiconductor memory device 250 but also a controller 276 which controls the semiconductor memory device 250 and which transmits and receives predetermined signals to and from the external device as shown in FIG. 24. The controller 276 comprises interface units (I/F) 271 and 272, a microprocessor unit (MPU) 273, a buffer RAM 274, and an error correction code unit (ECC) 275 included in the interface unit (I/F) unit 272.

The interface unit (I/F) 271 transmits and receives predetermined signals to and from the external device. The interface unit (I/F) 272 transmits and receives predetermined signals to and from the semiconductor memory device 250. The microprocessor unit (MPU) 273 converts logical addresses into physical addresses. The buffer RAM 274 temporarily stores data. The error correction code unit (ECC) 275 generates error correction codes.

The command signal line CMD, the clock signal line CLK, and the signal line DAT are connected to the memory card 260. The number of control signal lines, the bit width of the signal line DAT, and the circuit configuration of the controller 276 may be appropriately modified.

(Application 4)

Figure 25:
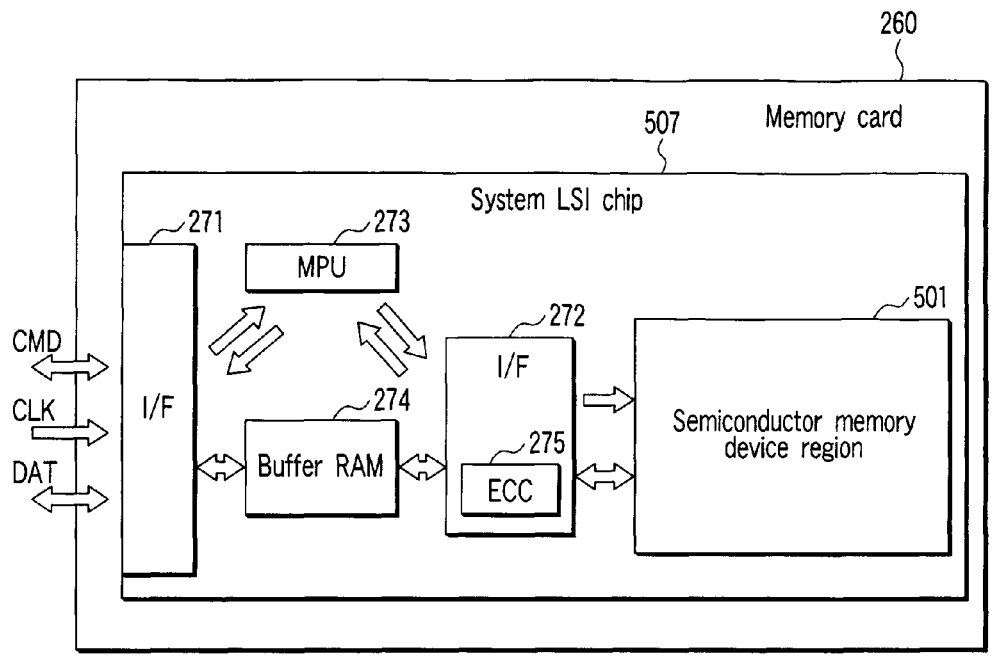
FIG. 25 is a block diagram of a memory card showing an application of the nonvolatile semiconductor memory.

In another example of the configuration of the memory card 260, as shown in FIG. 25, the interface units (I/F) 271 and 272, the microprocessor unit (MPU) 273, the buffer RAM 274, the error correction code unit (ECC) 275 included in the interface unit (I/F) unit 272, and a semiconductor memory device region 501 are all formed into a single system LSI chip 507. The system LSI chip 507 is mounted in the memory card 260.

(Application 5)

Figure 26:
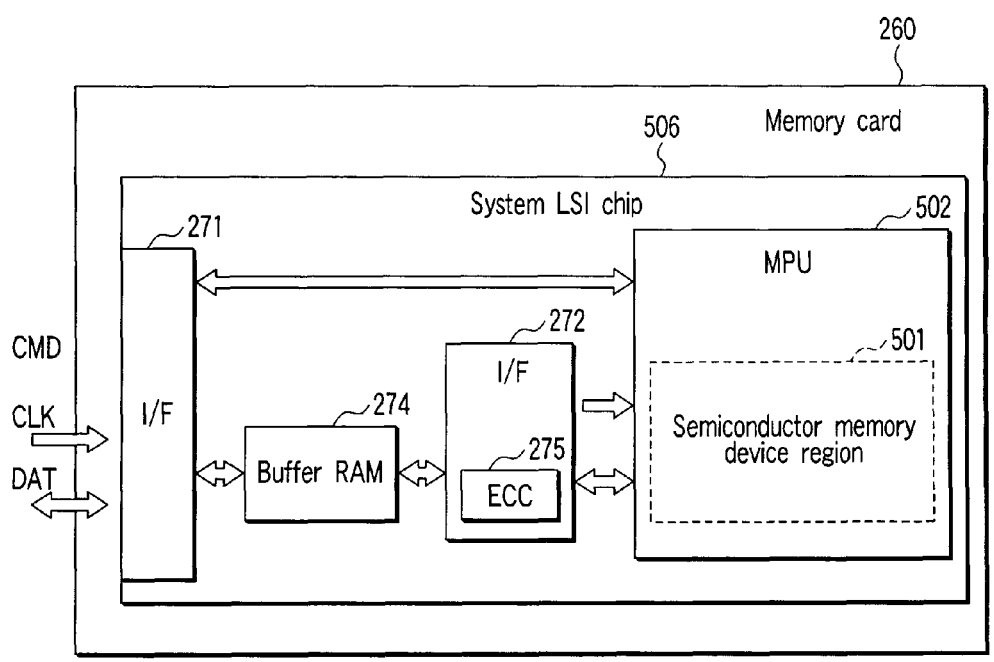
FIG. 26 is a block diagram of a memory card showing an application of the nonvolatile semiconductor memory.

In another example of the configuration of the memory card 260, as shown in FIG. 26, the semiconductor memory device region 501 is formed in the microprocessor unit (MPU) to obtain a memory-mixed MPU 502. Then, the memory-mixed MPU 502, the interface units (I/F) 271 and 272, the microprocessor unit (MPU) 273, the buffer RAM 274, and the error correction code unit (ECC) 275 included in the interface unit (I/F) unit 272 are all formed into a single system LSI chip 506. The system LSI chip 506 is mounted in the memory card 260.

(Application 6)

In another example of the configuration of the memory card 260, as shown in FIG. 27, a flash memory 503 in the EEPROM mode which has a NAND flash memory and a ROM region comprising a byte EEPROM is used instead of the semiconductor memory device 250, shown in FIG. 23 or 24.

The flash memory 503 in the EEPROM mode having the ROM region may of course be formed on the same chip on which the controller 276 is formed to provide a single system LSI chip 507 as shown in FIG. 25. Further, as shown in FIG. 26, a semiconductor memory device region comprising the flash memory 503 in the EEPROM mode having the ROM region may be formed in the microprocessor unit (MPU) 273 to obtain a memory-mixed MPU 502. Then, the memory-mixed MPU 502, the interface units (I/F) 271 and 272, and the buffer RAM 274 may be formed into a single system LSI chip 506.

(Application 7)

A possible application of the memory cards 260 shown in FIGS. 23 to 27 is a memory card holder 280 as shown in FIG. 28. The memory card holder 280 can accommodate the memory card 260 comprising the nonvolatile semiconductor memory described in any of the first to eighth embodiments of the present invention, as the semiconductor memory device 250. The memory card holder 280 is connected to an electronic device (not shown) and is operative as an interface between the memory card 260 and the electronic device. The memory card holder 280 can provide various functions in addition to those of the controller 276, microprocessor unit (MPU) 273, buffer RAM 274, error code correction unit (ECC) 275, and interface units (I/F) 271 and 272, which are shown in FIGS. 23 to 27 and included in the memory card 260.

(Application 8)

Figure 29:
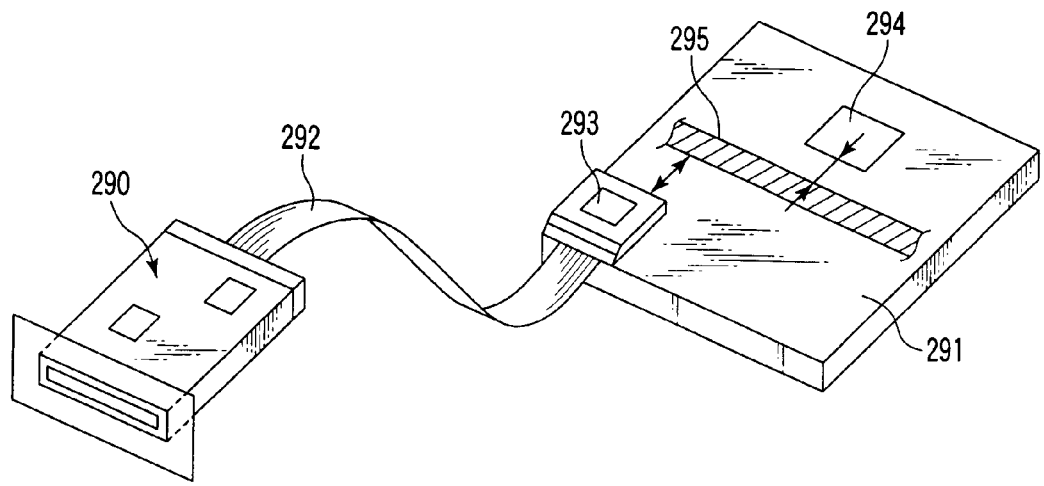
FIG. 29 is a diagram of the configuration of an apparatus comprising a memory card and a card holder, showing an application of the nonvolatile semiconductor memory.

Another application of the nonvolatile semiconductor memory will be described with reference to FIG. 29. FIG. 29 shows a connector 290 that can accommodate the memory card 260 or the memory card holder 280. One of the memory card 260 and the memory card holder 280 comprises the nonvolatile semiconductor memory described in detail in any of the first to eighth embodiments of the present invention, as the semiconductor memory device 250 or the semiconductor memory device region 501, the memory-mixed MPU 502, or the flash memory 503 in the EEPROM mode having the ROM region. The memory card 260 or the memory card holder 280 is installed in and electrically connected to the connector 290. The connector 290 is connected to a circuit board 291 comprising a CPU 294 and a bus 295, via a connection wire 292 and an interface circuit 293.

(Application 9)

Figure 30:
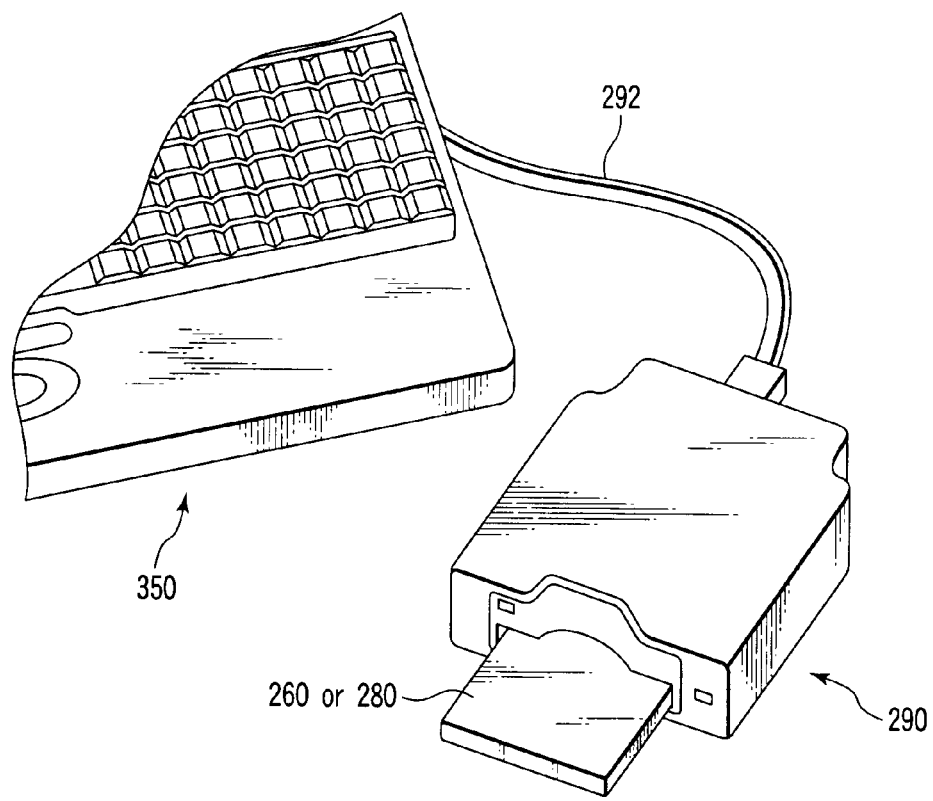
FIG. 30 is a diagram of the configuration of an apparatus containing a memory card, showing an application of the nonvolatile semiconductor memory.

Another application of the nonvolatile semiconductor memory will be described with reference to FIG. 30. One of the memory card 260 and the memory card holder 280 comprises the nonvolatile semiconductor memory described in any of the first to eighth embodiments of the present invention, as the semiconductor memory device 250 or the semiconductor memory device region 501, the memory-mixed MPU 502, or the flash memory 503 in the EEPROM mode having the ROM region. The memory card 260 or the memory card holder 280 is installed in and electrically connected to the connector 290. The connector 290 is connected to a personal computer (PC) 350 via the connection wire 292.

(Application 10)

Another application of the nonvolatile semiconductor memory will be described with reference to FIG. 31. The memory card 260 comprises the nonvolatile semiconductor memory described in detail in any of the first to eighth embodiments of the present invention, as the semiconductor memory device 250 or the semiconductor memory device region 501, the memory-mixed MPU 502, or the flash memory 503 in the EEPROM mode having the ROM region. FIG. 31 shows an example in which this memory card 260 is applied to a digital camera 650 containing the memory card holder 280.

(IC Card)

(Application 11)

As shown in FIGS. 32 and 33, another application of the nonvolatile semiconductor memory in accordance with any of the first to eighth embodiments of the present invention constitutes and an IC (Interface Circuit) card 500 including an MPU 400 comprising the semiconductor memory device 250, ROM 410, RAM 420, and CPU 430, and a plane terminal 600. The IC card 500 can be connected to an external device via the plane terminal 600. The plane terminal 600 is coupled to MPU 400 in the IC card 500. CPU 430 includes an arithmetic section 431 and a control section 432. The control section 432 is coupled to the semiconductor memory device 250, ROM 410, and RAM 420. Desirably, MPU 400 is molded on one surface of the IC card 500, and the plane terminal 600 is formed on the other surface of the IC card 500.

In FIG. 33, the nonvolatile semiconductor memory described in detail in any of the first to eighth embodiments of the present invention is applicable to the semiconductor memory device 250 or ROM 410. The page mode, the byte mode, and a pseudo EEPROM mode are possible for the operation of the nonvolatile semiconductor memory.

(Application 12)

Figure 34:
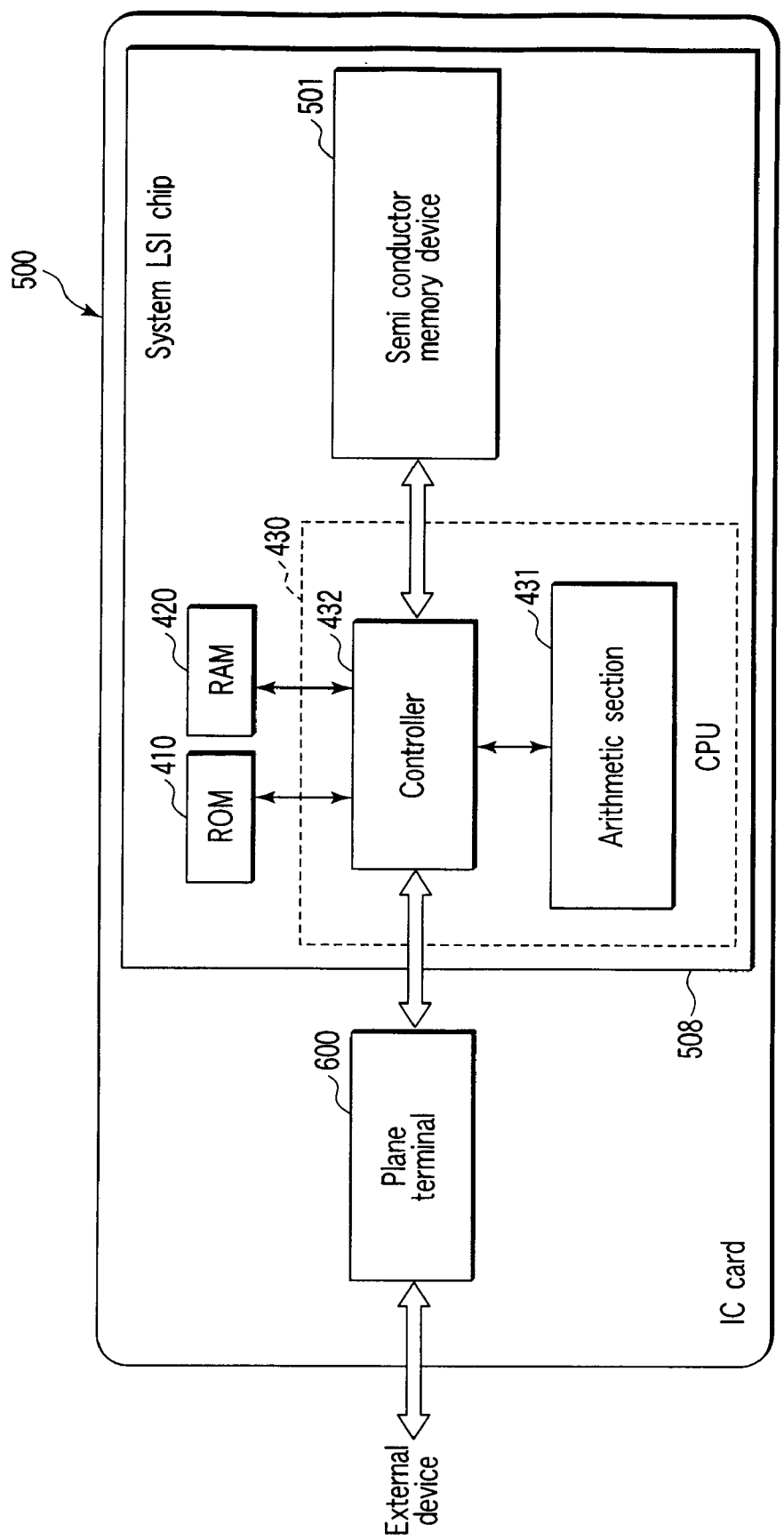
FIG. 34 is a diagram of the configuration of an IC card, showing an application of the nonvolatile semiconductor memory.

In another example of the configuration of the IC card 500, as shown in FIG. 34, ROM 410, RAM 420, CPU 430, and the semiconductor memory device region 501 are all formed into a single system LSI chip 508. The system LSI chip 508 is built into the IC card 500. In FIG. 34, the nonvolatile semiconductor memory described in detail in any of the first to eighth embodiments of the present invention is applicable to the semiconductor memory device region 501 and ROM 410.

The page mode, the byte mode, and the pseudo EEPROM mode are possible for the operation of the nonvolatile semiconductor memory.

(Application 13)

In another example of the configuration of the IC card 500, as shown in FIG. 35, ROM 410 is built into the semiconductor memory device region 501 to generally provide a flash memory 510 in the EEPROM mode having a ROM region.

Further, the flash memory 510 in the EEPROM mode having a ROM region, RAM 420, and CPU 430 are all formed into a single system LSI chip 509. The system LSI chip 509 is built into the IC card 500.

(Application 14)

In another example of the configuration of the IC card 500, as shown in FIG. 36, ROM 410 is built into the semiconductor memory device 250, shown in FIG. 33, to generally provide a flash memory 510 in the EEPROM mode having a ROM region. The flash memory 510 in the EEPROM mode having a ROM region is built into MPU 400 as in the case of FIG. 33.

[Other Embodiments]

The stack gate structure has been disclosed as the basic element structure of the memory cell transistors in the nonvolatile semiconductor memory in accordance with any of the first to eighth embodiments. However, the present invention is not limited to this. Of course, the present invention is applicable to a sidewall control gate structure, a MONOS structure, or the like. Further, many variations or modifications may of course be made to the manufacturing steps.

Moreover, the memory cell transistors in the nonvolatile semiconductor memory in accordance with any of the first to eighth embodiments are not limited to memories based on binary logic. For example, the memory cell transistors are applicable to memories based on multiple-level logic, that is, logic for at least three levels. For example, a nonvolatile semiconductor memory storing four levels can achieve a memory capacity double that of a nonvolatile semiconductor memory storing two levels. Moreover, the memory cell transistors are applicable to nonvolatile semiconductor memories storing m levels (m>3).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory comprising:
a plurality of memory cell transistors provided in a memory cell transistor region, and a plurality of resistors provided in a resistor region positioned around a periphery of the memory cell transistor region,
each memory cell transistor having:
source/drain diffusion layers provided in a semiconductor substrate;
a first gate insulating film located on the semiconductor substrate between the source/drain diffusion layers;
a floating gate electrode layer located on the first gate insulating film;
a first inter-gate insulating film located on the floating gate electrode layer;
a control gate electrode layer located on the first inter-gate insulating film; and
a first low-resistance layer located on the control gate electrode layer,
each resistor having:
a second gate insulating film located on the semiconductor substrate;
a first electrode layer located directly on the second gate insulating film;
a second inter-gate insulating film located on the first electrode layer;
a second electrode layer located on the second inter-gate insulating film and isolated from the first electrode layer electrically;
a mask film located on the second electrode layer;
a second low-resistance layer located on the second electrode layer adjacent to the mask film, the second low-resistance layer comprising at least two parts being located on the second electrode layer, wherein the parts of the second low-resistance layer are electrically separated from each other;
a first interlayer insulating film covering the memory cell transistor and the resistor;
a second interlayer insulating film located on the first and second low-resistance layer, the first interlayer insulating film, and the mask film; and
contact plugs located within the second interlayer insulating film, separate and distinct from the second low-resistance layer, and connected to the second low-resistance layer, a width of each contact plug being different from a width of a respective part of the second low-resistance layer,
wherein the second electrode layer is extended from one part of the second low-resistance layer to an other part of the second low-resistance layer.

2. The nonvolatile semiconductor memory according to claim 1, wherein the second electrode layer has a higher resistivity than the second low-resistance layer.

3. The nonvolatile semiconductor memory according to claim 1, wherein the second electrode layer is a polysilicon layer.

4. The nonvolatile semiconductor memory according to claim 1, wherein the second low-resistance layer is a metal silicide layer.

5. The nonvolatile semiconductor memory according to claim 1, wherein the resistor is located on an isolation layer provided in the semiconductor substrate.

6. The nonvolatile semiconductor memory according to claim 1, wherein the second electrode layer has a greater film thickness than the first electrode layer.

7. The nonvolatile semiconductor memory according to claim 1, wherein a resistance of the resistor is changed by a contact area between the second low-resistance layer and the second electrode layer.

8. The nonvolatile semiconductor memory according to claim 1, wherein the resistance is determined by connecting a plurality of the resistors together in series.

9. The nonvolatile semiconductor memory according to claim 1, wherein the memory cell transistor region is a NAND memory cell array.

10. The nonvolatile semiconductor memory according to claim 1, wherein the memory cell transistor region is an AND memory cell array.

11. The nonvolatile semiconductor memory according to claim 1, wherein the memory cell transistor region is a NOR memory cell array.

12. The nonvolatile semiconductor memory according to claim 1, wherein the memory cell transistor region is a two-transistor/cell memory cell array.

13. The nonvolatile semiconductor memory according to claim 1, wherein the memory cell transistor region is a three-transistor/cell memory cell array.

14. The nonvolatile semiconductor memory according to claim 1, wherein the first electrode layer is continuous under the second electrode layer.

15. The nonvolatile semiconductor memory according to claim 14, wherein the second electrode layer has a higher resistivity than the second low-resistance layer.

16. The nonvolatile semiconductor memory according to claim 14, wherein the second electrode layer is a polysilicon layer.

17. The nonvolatile semiconductor memory according to claim 14, wherein the second low-resistance layer is a metal silicide layer.

* * * * *